US011011696B1

(12) United States Patent
Peters et al.

(10) Patent No.: US 11,011,696 B1
(45) Date of Patent: May 18, 2021

(54) PIEZOELECTRIC POWER GENERATOR

(71) Applicant: Michael H. Peters, Washington, DC (US)

(72) Inventors: Michael H. Peters, Washington, DC (US); Alexander M. Stufflebeam, Indianapolis, IN (US); John N. Fitzpatrick, Indianapolis, IN (US); John J. Fitzpatrick, Indianapolis, IN (US); David V. N. Galloway, Indianapolis, IN (US); Lukas R. Bearden, Knoxville, TN (US); Adam Scott, Westerville, OH (US); Garrett S. Yesmunt, Indianapolis, IN (US); Mitchel H. Szazynski, Indianapolis, IN (US)

(73) Assignee: Michael H Peters, Washington, DC (US)

( * ) Notice: Subject to any disclaimer, the term of this patent is extended or adjusted under 35 U.S.C. 154(b) by 0 days.

(21) Appl. No.: 16/265,152

(22) Filed: Feb. 1, 2019

Related U.S. Application Data

(63) Continuation of application No. 15/473,578, filed on Mar. 29, 2017, now Pat. No. 10,199,558.
(Continued)

(51) Int. Cl.
*H01L 41/113* (2006.01)
*H02N 2/18* (2006.01)
(Continued)

(52) U.S. Cl.
CPC ............ *H01L 41/1136* (2013.01); *H02K 7/02* (2013.01); *H02K 7/116* (2013.01); *H02K 7/1807* (2013.01); *H02N 2/18* (2013.01); *Y02E 60/16* (2013.01)

(58) Field of Classification Search
CPC ............... H01L 41/113; H01L 41/1132; H01L 41/1134; H01L 41/1136; H01L 41/1138
(Continued)

(56) References Cited

U.S. PATENT DOCUMENTS 3,885,163 A   5/1975  Toberman
6,433,465 B1* 8/2002  McKnight ............ A43B 3/0005
                                              310/319
(Continued)

FOREIGN PATENT DOCUMENTS

CN    204408216    6/2015
JP    2004028225   1/2004
(Continued)

OTHER PUBLICATIONS

"Flywheel Energy Storage," reprinted from Wikipedia, https://web.archive.org/web/20160708053818/https://en.wikipedia.org/wiki/Flywheel energy storage on Sep. 13, 2018.
(Continued)

*Primary Examiner* — Derek J Rosenau
(74) *Attorney, Agent, or Firm* — Fish & Richardson P.C.

(57) ABSTRACT

In accordance with the present application, a high-density, low-impedance piezoelectric power generator is provided. In an example embodiment, the piezoelectric power generator has a plurality of piezoelectric elements arranged in a first predefined pattern; a plurality of actuators arranged in a second predefined pattern operably positioned to excite one or more of the plurality of the piezoelectric elements simultaneously within at least a first subset; and an electrical conduction system connected to sum the electrical power produced by the simultaneously excited piezoelectric elements within the first subset and for conducting an electrical current.

41 Claims, 27 Drawing Sheets

Related U.S. Application Data

(60) Provisional application No. 62/411,549, filed on Oct. 22, 2016, provisional application No. 62/412,293, filed on Oct. 25, 2016, provisional application No. 62/431,851, filed on Dec. 9, 2016.

(51) Int. Cl.
  *H02K 7/02* (2006.01)
  *H02K 7/116* (2006.01)
  *H02K 7/18* (2006.01)

(58) Field of Classification Search
  USPC .......................................................... 310/339
  See application file for complete search history.

(56) References Cited

U.S. PATENT DOCUMENTS

| | | | |
|---|---|---|---|
| 7,589,428 | B2 | 9/2009 | Ghassemi |
| 7,696,673 | B1* | 4/2010 | Yavid ...................... F42C 11/02 310/329 |
| 8,766,493 | B2 | 7/2014 | Hunter |
| 9,136,778 | B2 | 9/2015 | Petrenko et al. |
| 9,287,753 | B2 | 3/2016 | Jang |
| 2002/0185937 | A1* | 12/2002 | Heim ...................... H02N 2/046 310/339 |
| 2005/0258717 | A1 | 11/2005 | Mullen |
| 2005/0280334 | A1 | 12/2005 | Ott et al. |
| 2006/0118678 | A1 | 6/2006 | Wells et al. |
| 2007/0090723 | A1 | 4/2007 | Keolian |
| 2010/0207491 | A1* | 8/2010 | Gammaitoni ....... H01L 41/1136 310/339 |
| 2011/0278990 | A1 | 11/2011 | Knowles |
| 2012/0007473 | A1 | 1/2012 | Oh |
| 2013/0106367 | A1 | 5/2013 | Beaudoin |
| 2014/0333167 | A1 | 11/2014 | Akamatsu |
| 2015/0104295 | A1 | 4/2015 | Viguie |
| 2015/0171720 | A1 | 6/2015 | Jie |

FOREIGN PATENT DOCUMENTS

| | | |
|---|---|---|
| JP | 2005045870 | 2/2005 |
| JP | 2005229655 | 8/2005 |
| JP | 2005245189 | 9/2005 |
| KR | 20110010874 | 2/2011 |

OTHER PUBLICATIONS

"Flywheel," reprinted from Wikipedia, https://web.archive.org/web/20160914000042/https://en.wikipedia.org/wiki/Flywheel on Sep. 13, 2018.

"Vibration—Powered Generator," reprinted from Wikipedia https://web.archive.org/web/20150410034023/http://en.wikipedia.org/wiki/Vibration-powered generator on Sep. 13, 2018.

Makki, N., and Pop-Iliev, R., "Piezoelectric Power Generation in Tires," SPIE Newsroom, May 20, 2011.

"Piezoelectric Energy Harvesting Kit," Piezo Systems, Inc., Catalog #8, 2011.

Rex Garland, "Piezoelectric Roads in California," Submitted as Coursework for PH240, Stanford University. Fall 2012. reprinted from http://large.standord.edu/courses/2012/ph240/garland1/.

Jung, Woo-Suk, et al., "High Output Piezo/Triboelectric Hybrid Generator," *Scientific Reports*, 5:9309. Mar. 20, 2015.

Len Calderone, "PiezoelectricPowerGeneration inAutomotive Tires," AltEnergyMag, Jan. 2, 2018.

Kour, Ravjeet, and Charif, Ahmad, "Piezoelectric Roads: Energy Harvesting Method Using Piezoelectric Technology." Innov Ener Res, vol. 5(1). Mar. 25, 2016.

Ross, Philip E., "Good Vibrations? California to Test Using Road Rumbles as a Power Source," IEEE Spectrum (blog), Apr. 19, 2017, reprinted from http://spectrum.ieee.org/cars-that-think/transportation/infrastructure/good-vibrations-california-to-test-road-vibrations-as-a-power-source.

Cui, Y., et al., "Vibration Piezoelectric Energy Harvester with Multi-Beam," AIP Advances 5, 041332 (2015). Apr. 21, 2015.

Yang, H., et al., "A Preliminary Study on the Highway Piezoelectric Power Supply System," International Journal of Pavement Research and Technology 11 (2018) 168-175, available online Sep. 9, 2017.

Yang, C.H., et al., "Feasibility Study of Impact-Based Piezoelectric Road Energy Harvester for Wireless Sensor Networks in Smart Highways," Sensors and Actuators A 261 (2017) 317-324.

Zhao, H., et al., "Test and Analysis of Bridge Transducers for Harvesting Energy from Asphalt Pavement," International Journal of Transportation Science and Technology, vol. 4, No. 1, 2015, pp. 17-28.

Papagiannakis, A.T., et al., "Energy Harvesting from Roadways," Procedia Computer Science 83 (2016) 758-765.

Xu, X., et al., "Application of Piezoelectric Transducer in Energy Harvesting in Pavement," International Journal of Pavement Research and Technology 11 (2018) 388-395.

Xiaoming Sun, "An Overview on Piezoelectric Power Generation System for Electricity Generation." Journal of Power and Energy Engineering. 2017. 5. 11-18.

* cited by examiner

PIEZOELECTRIC POWER GENERATOR

CROSS-REFERENCE TO RELATED APPLICATION

This application is a continuation of U.S. patent application Ser. No. 15/473,578, filed Mar. 29, 2017, now allowed, which claims priority from U.S. Provisional patent application Ser. No. 62/411,549, filed Oct. 22, 2016, entitled "PIEZOELECTRIC SYSTEM FOR GENERATING ELECTRICAL CURRENT", U.S. Provisional patent application Ser. No. 62/412,293, filed Oct. 25, 2016, entitled "PIEZOELECTRIC SYSTEM FOR GENERATING ELECTRICAL CURRENT", and U.S. Provisional patent application Ser. No. 62/431,851, filed Dec. 9, 2016, entitled "PIEZOELECTRIC SYSTEM FOR GENERATING ELECTRICAL CURRENT". The contents of the prior applications are incorporated herein by reference.

BACKGROUND

The present invention relates generally to a power generating system, in particular a system which harvests mechanical energy and converts it to electricity.

The current state of piezo technology suffers from lack of vision. The underdeveloped state of the art breeds small-scale, limited applications, which in turn do little to encourage further development of the piezo technology itself—a technology with the potential to revolutionize green energy with the world's first large-scale, cost-effective green energy solution.

Typical power-generating applications of piezo technology include piezo-powered tire pressure sensors, piezo-powered wrist watches, and other small-scale inventions. Almost without exception, all of these applications mount the base of a piezo reed to a surface expected to move or vibrate incidentally, and this incidental motion, yielding inconsistent piezo generation, is just enough to power very small devices. The piezo reed never achieves its maximum efficiency.

Moreover, the maximum efficiency for a single piezo reed today is low, with impedance measured in kilo-Ohms. In theory, this high impedance could be brought down either by improving the piezo materials or by using a larger number of piezo reeds in parallel, but advancements in piezo materials have so far not been well rewarded, given the small-scale market, and multiple reeds for today's applications of incidental motion would only cancel each other, because their motions would be out of phase.

For these reasons, vision for where piezo technology could take us has been low. Even in the best of circumstances (never achieved through incidental motion) a single piezo reed cannot generate enough electricity to power anything but the smallest of devices, and the economic incentives are minimal for improving the materials to lower the impedance of an individual reed. Using multiple reeds only compounds the problem by introducing phase cancelling. Thus, piezo technology is seen to be only good for small-scale applications. No one has yet dreamed that we will one day power our cities with clean piezo electricity.

SUMMARY

In accordance with the present application, a high density, low impedance piezoelectric power generator is provided. In an example embodiment, the piezoelectric power generator comprises: a) a plurality of piezoelectric elements arranged in a first predefined pattern; b) a plurality of actuators arranged in a second predefined pattern operably positioned to excite one or more of the plurality of the piezoelectric elements simultaneously within at least a first subset; and c) an electrical conduction system connected to sum electrical power produced by the simultaneously excited piezoelectric elements within the first subset and for conducting an electrical current.

In another preferred version, the piezoelectric power generator comprises: a) a plurality of piezoelectric elements arranged in a first predefined pattern; b) a first plurality of actuators operably positioned in a first series operable to excite the plurality of piezoelectric elements simultaneously within a first subset producing a first electrical output phase; and a second plurality of actuators operably positioned in a second series configured to excite a plurality of piezoelectric simultaneously within a second subset producing a second electrical output phase; and c) an electrical conduction system connected to sum electric power produced by the first subset, sum electrical power produced by the second subset, and sum electrical power produced by the first subset and the second subset collectively in order to conduct and provide an overall electrical current produced by the piezoelectric power generator.

In a preferred version, the plurality of actuators are arranged in a radial, alternating pattern—wherein the first series of actuators is concentrically aligned with the second series of actuators forming an alternating, offset pattern and providing a concentric pathway therebetween, wherein the plurality of piezoelectric elements are radially and sequentially aligned and are configured to freely move radially throughout the concentric pathway.

In yet another detailed version, the plurality of piezoelectric elements laterally move through a cycle, simultaneously, in a first phase, the first series of actuators displace the first subset of piezoelectric elements in a first direction and the second series of actuators displace the second subset of piezoelectric elements in a second direction, and in a second phase completing a full cycle, the first series of actuators displace the second subset in an opposing third direction and the second series of actuators displace the first subset in an opposing fourth direction, thereby collectively producing an oscillating movement of each subset throughout the piezoelectric elements path of motion.

In an example version, the piezoelectric elements may comprises a free region comprising a first magnetic material and one or more fixed ends; and at least one of the plurality of actuators comprises a second magnetic material, wherein the second magnetic material and the first magnetic material excite the at least one piezoelectric element by passing in proximity providing a period of magnetic force, thereby temporarily displacing the free region, flexing the piezoelectric element.

An example method of operating a piezoelectric power generator may comprise: using a plurality of actuators operably positioned in a first series in order to excite a plurality of piezoelectric elements simultaneously within a first subset producing a first electrical output phase, and in a second series to excite a plurality of piezoelectric elements simultaneously within a second subset producing a second electrical output phase; and conducting an electrical current created by the excitation.

These and other features of the present invention will become readily apparent upon further review of the following specification and drawings.

BRIEF DESCRIPTION OF THE DRAWINGS

These and other features, aspects, and advantages of the present invention will become better understood with regard to the following description and accompanying figures where.

DETAILED DESCRIPTION

Figure 1:
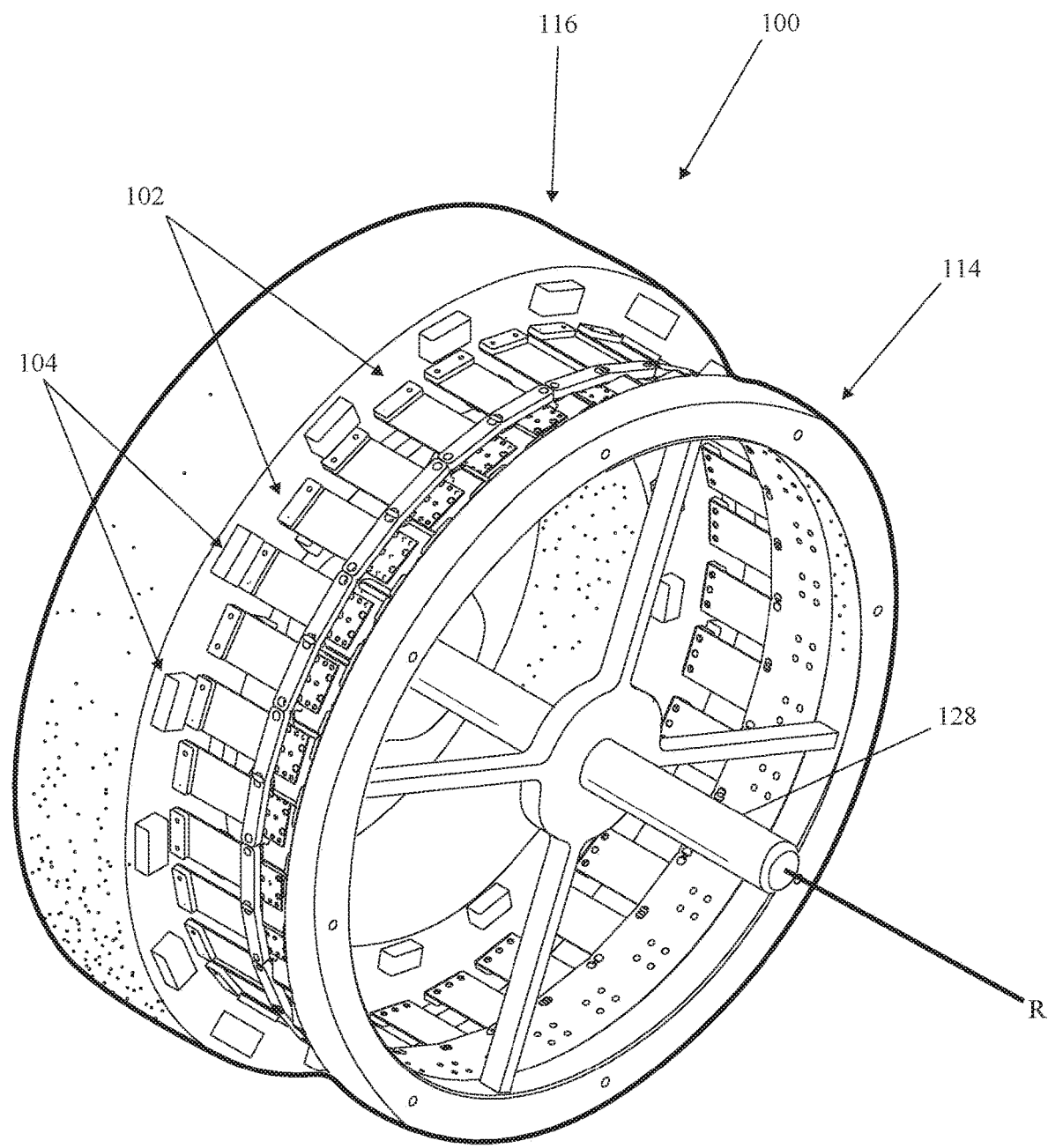
FIG. 1 is a perspective view showing a version of the piezoelectric power generator.

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other versions that depart from these specific details. In other instances, detailed descriptions of well-known devices, circuits, and methods are omitted so as not to obscure the description of the present invention with unnecessary detail.

Moreover, the description is not to be taken in the limiting sense, but is made merely for the purpose illustrating the general principles of the invention, since the scope of the invention is best defined by the appended claims. Various inventive features are described below that can each be used independently of one another or in combination with other features.

By way of overview, the piezoelectric power generator is the very first high-density, low-impedance piezoelectric generator. Not only does it solve many of the problems that have until now held back piezo technology and relegated it to small applications, but in moving the discussion toward grid-level power generation, it creates an industry and a market where further developments in piezoelectric technology will be economically rewarded. As large-scale piezoelectric power generation opens the world's eyes to the potential of the technology, rapid improvements in the material science and manufacturing of piezoelectric devices will follow. Efficiency will rise and cost will fall as industry-level economic incentives drive further research and development.

The piezoelectric power generator employs several innovations to overcome the problems associated with mass usage of piezo reeds and maximize efficiency, including deflecting the reeds at the tip, deflecting the reeds magnetically, micro-layering of piezoelectric surfaces, and constantly forcing deflection, versus relying on the natural, dissipating frequency of the reeds.

Instead of relying on the incidental motion of the piezo reed base to agitate the reed indirectly, as has always been done before, the piezoelectric power generator deflects the piezo reed tips directly. Thus, every movement is intentional, purposeful, and calculated for maximum efficiency. It is a mark of how underappreciated piezoelectric technology has been that this concept alone turns piezoelectric thought on its head and opens myriad avenues of potential for the technology.

Deflecting the reeds from the tips could introduce other problems, such as high wear on the reeds, so the piezoelectric power generator uses magnets, without making physical contact. This magnetic deflection not only lengthens the life of the reeds by reducing wear and tear, but provides maximum efficiency, eliminating friction and energy loss due to heat and sound.

Perhaps the most crucial innovation is to constantly force deflection, eliminating the intricacies and inefficiencies of natural vibration and solving the problem of phase cancellation. If a piezo reed is agitated only occasionally, and then left to vibrate on its own between times, the agitation must come at extremely precise intervals to set the reed vibrating at its harmonic frequency, or else the agitation itself will interfere with the natural vibrations and introduce inefficiency. If, on the other hand, the reed is constantly being forced to deflect one way and then the other, and never left to vibrate on its own, the frequency of deflection is much less consequential. The reed can be deflected at any one of many frequencies and still have steady, dependable, uninterrupted, and efficient oscillation.

This steady oscillation also enables the piezoelectric power generator to harness the power of a multitude of piezoelectric reeds in parallel, overcoming cancellation effects by all oscillating in phase, not only compounding the power generated, but driving the impedance down. Whereas before, phase cancellation made it impractical to use multiple piezo devices in parallel, now steady, controlled oscillation allows us to control the phase of the oscillation and harmonize as many piezo reeds as necessary so that they add to each other rather than cancelling each other. This multiplication of power generation, combined with the resultant massive division of impedance, allows piezoelectric power generation to be a viable option for large-scale, grid-level power generation.

The generator's efficiency can be further enhanced by advancements in the material science of individual piezo reeds. For example, the piezoelectric power generator will use piezoelectric reeds that have multiple piezoelectric layers in parallel. Even layering four or five piezoelectric surfaces in a single reed multiplies power generation and reduces impedance significantly, but the piezoelectric power generator will take advantage of micro-layering nanotechnology, allowing for piezo reeds that are made up of thousands of piezoelectric layers, each generating electricity in parallel with the others. Just as constant deflection does by overcoming phase cancellation, this massive layering will multiply the power generated and drive the impedance down to negligible levels.

The constant, systematic nature of the generator also allows it to harvest energy from myriad sources of kinetic energy. Whereas before, piezoelectric devices harvested vibrations and impulses by exciting only a single or very few piezoelectric elements during the impulse event, the dense energy piezoelectric generator makes it possible to use a single impulse event to excite hundreds or thousands of piezoelectric elements over an extended period of time, multiplying power yield and efficiency. Having developed a piezoelectric generator capable of producing grid-level power, we can now put it to use harvesting all sorts of otherwise wasted energy, from applications on roadways, railways, and seaways, to satellites, rockets, and space stations. The possibilities are limitless and clean.

The dense energy piezoelectric generator is innovative on multiple levels. Its technical innovations range from the simplicity of actuating the piezo reeds directly from the tip, to the complexity of micro-layering piezoelectric surfaces with nanotechnology. Time will tell, but perhaps the most enduring innovation will be the revolution in perspective and expansion of vision for piezoelectric technology. Starting now, piezoelectric energy is big. No longer is it relegated to small-scale applications. Now piezoelectric power generation has massive, grid-level potential, on the same scale as other green energy technologies.

Now referring to the figures, initially to FIG. 1-FIG. 5, a description of a first example version of the invention will be provided and is generally designated as numeral 100. The purpose of the piezoelectric power generator 100 is to convert mechanical energy into an electric current in an efficient manner by use of a piezoelectric material. The piezoelectric material can be selected from any type of material that provides an electrical charge when stress is applied to the structure such as crystals, certain ceramics, synthetic materials, graphene and biological matter such as bone, DNA, and various proteins.

FIG. 1 shows a non-limiting example generic version of the piezoelectric power generator 100. Generally speaking, the piezoelectric power generator 100 comprises a first structure 114 for supporting a plurality of piezoelectric elements 102 arranged in a first predefined pattern mounted thereon; a second support structure 116 for supporting a plurality of actuators 104 arranged in a second predefined pattern operably positioned thereon and configured to interact with one or more of the plurality of the piezoelectric elements 102 simultaneously within at least a first subset of piezoelectrical elements; and an electrical conduction system 106 connected to sum an electrical current produced by the simultaneously excited piezoelectric elements 102 within the first subset and for conducting an electrical current (See FIG. 13 schematic).

Generally, the first support structure 114 and the second support structure 116 are positioned proximate to and moveable with relation to the other. Thus, many different support structures can be constructed in order to carry out the function of the piezoelectric power generator 100, which either provide a relative rotation movement as illustrated in FIG. 1 or by way of example, a linear movement between the structures in order to simultaneously interact the actuators 104 with the piezoelectric elements 102.

In the example version, the first and second support structures 114, 116 are radially shaped structures or circular plates aligned in parallel. The first support structure 114 (FIG. 2) comprises a longitudinal axis R, a radial attachment surface 115, and an outer periphery 120. Similar in dimension, the second support structure 116 (FIG. 3) comprises a longitudinal axis of rotation R, a radial attachment surface 117, and an outer periphery 122. The first and second support structures 114, 116 are spatially rotatable relative to the other and both share the common longitudinal axis R. For purposes of example, in the version, the first support structure 114 supporting the piezoelectric elements 102 is stationary and the second support structure 116 is designed to freely rotate about the longitudinal axis of rotation R coupled with the rotary drive shaft 128.

Figure 2:
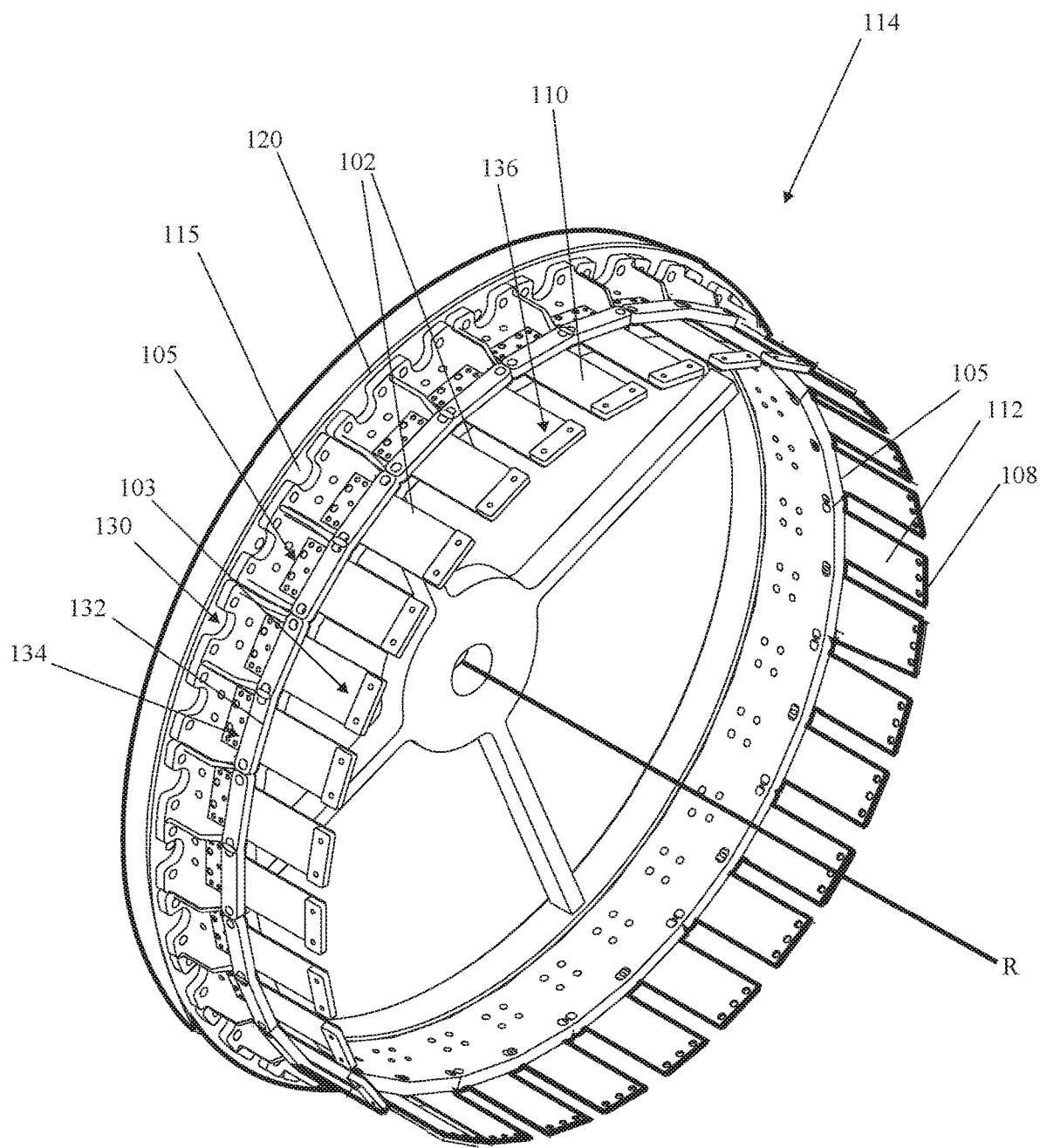
FIG. 2 is a perspective view of the first support structure of the version shown in FIG. 1.
Figure 6A:
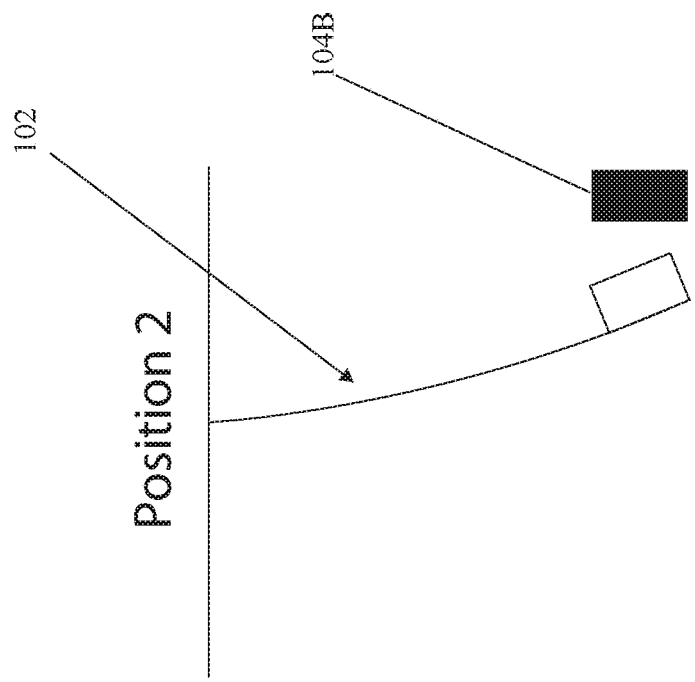
FIG. 6A is a diagram illustrating displacement of a cantilever type piezoelectric element throughout a path of motion.
Figure 6A:
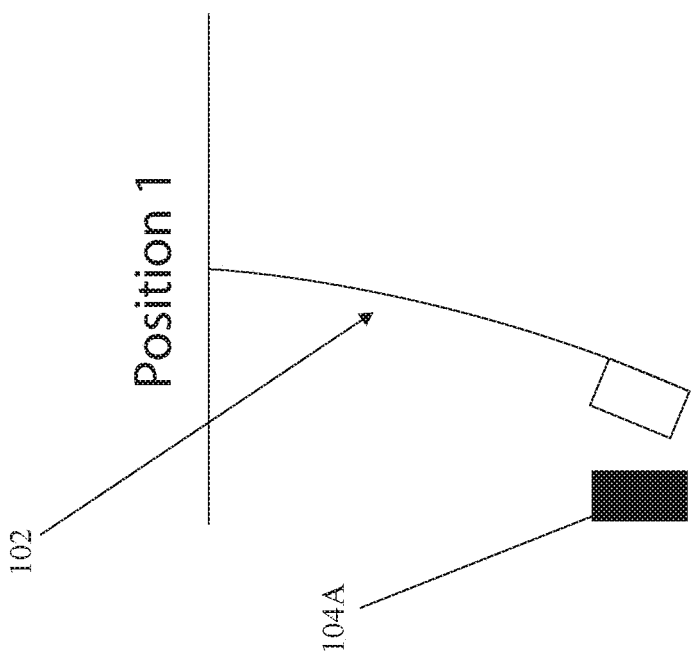
Figure 6B:
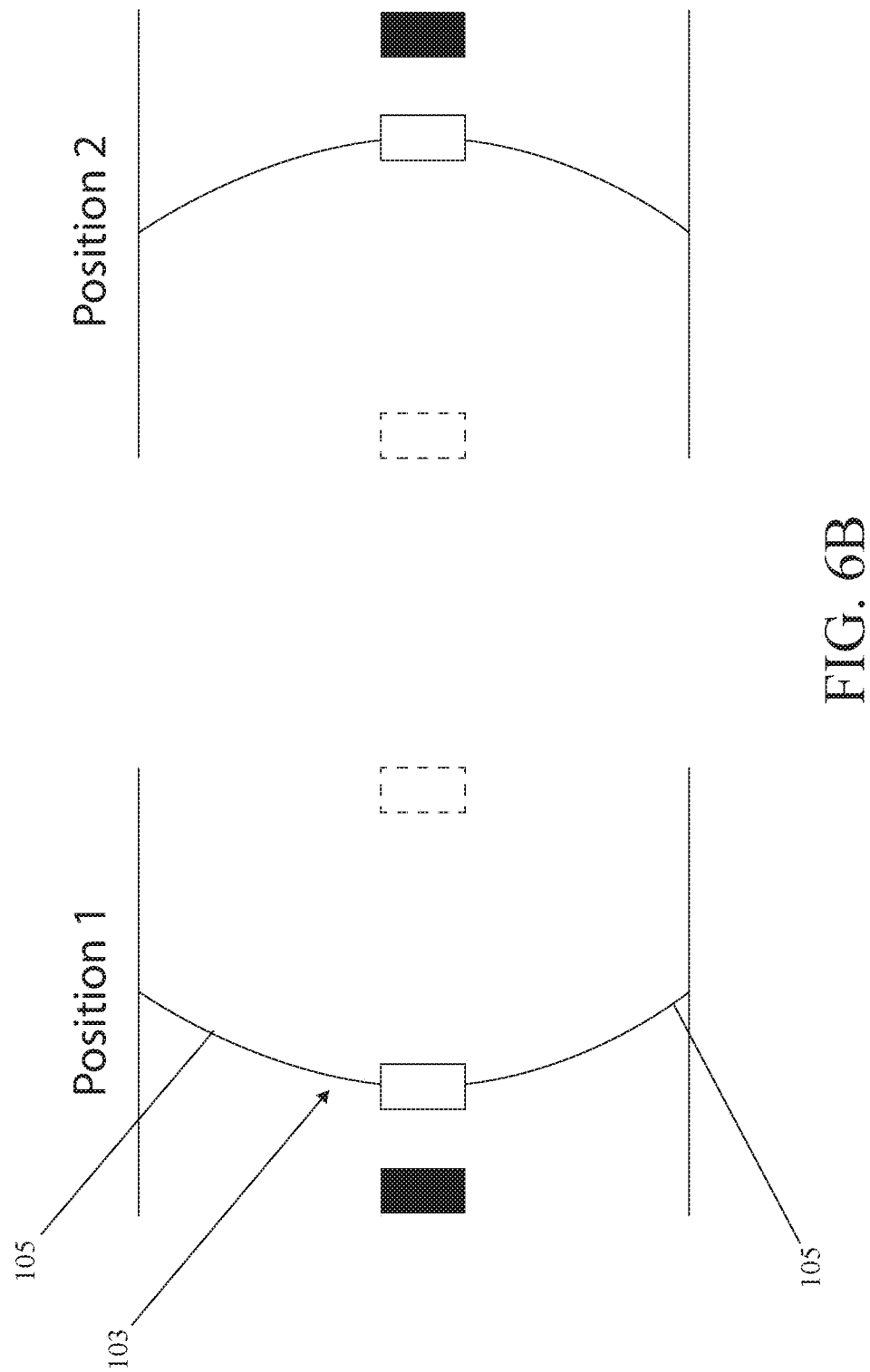
FIG. 6B is a diagram illustrating displacement of a fixed end type piezoelectric element throughout a path of motion.
Figure 7:
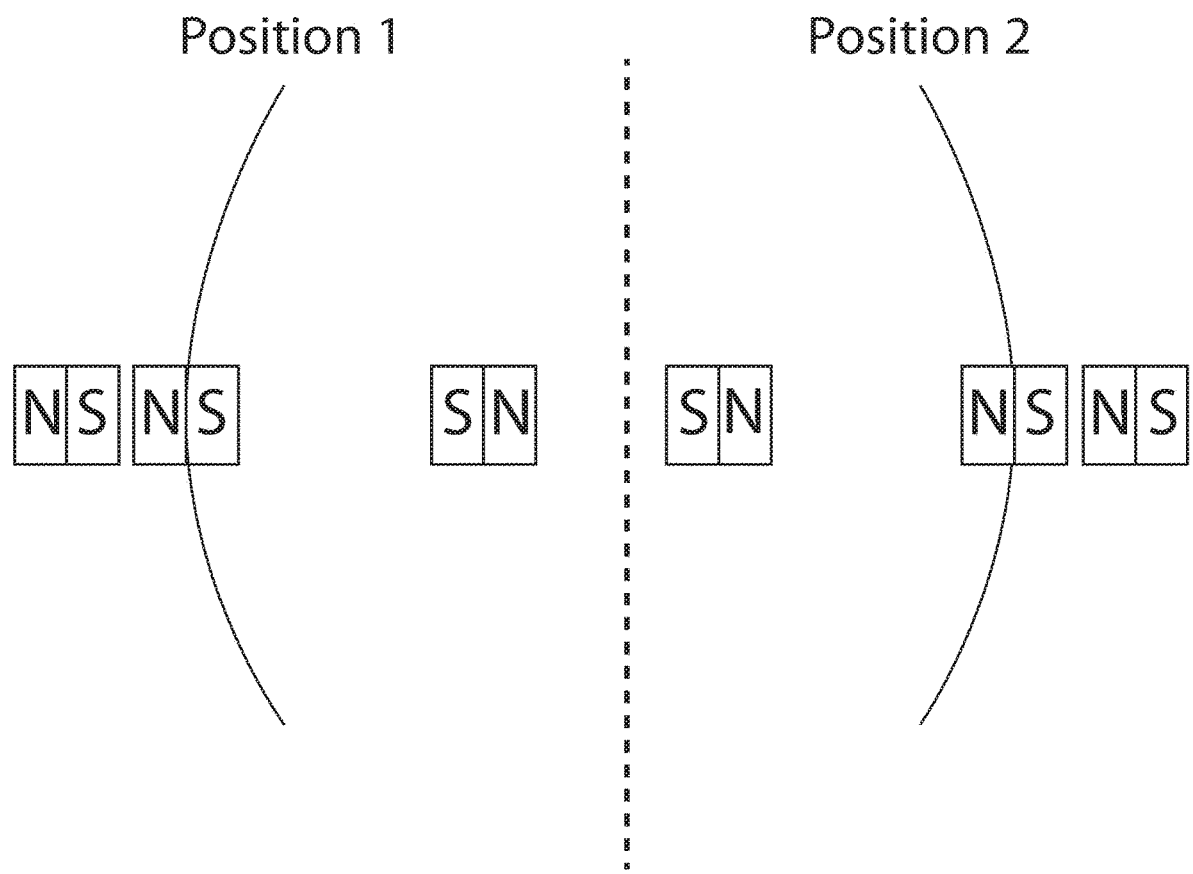
FIG. 7 is a diagram illustrating displacement of a piezoelectric element utilizing a pair of magnets.

As best illustrated by FIG. 2, at least one and preferably all of the plurality of piezoelectric elements 102 are cantilever type piezoelectric reeds having one or more fixed ends 105 and one or more free regions 103. In the example version, each piezoelectric element 102 comprises a fixed end 105 extending a length to the free region 103 or free end 108 and lateral surfaces defining a first side 110 and an opposing second side 112. The free end 108 located at the free region 103 of piezoelectric elements 102 has a magnetic material portion which, for example, comprises either a magnet material exhibiting properties of magnetism or, ideally, a ferrous mass 136. The magnet material may simply be a magnet (See FIG. 7 as example). It will be known, that other configurations of the piezoelectric element 102 can be envisioned. By way of example as best illustrated by FIG. 6B, the piezoelectric reed having a length can be fixedly attached at each terminating end 105, providing a free region 103 therebetween as opposed to having a free region 103 near the free end 108 as previously described.

Preferably, the piezoelectric elements 102 can be affixed or mounted at their fixed ends 105 to the first support structure 114 by any suitable means. For example, the fixed ends 105 can be affixed by a mounting bracket 130. The mounting bracket 130 has a slot 132 formed by the bracket 130 itself and an attachment band 134. The attachment band 134 is configured to be attachably removable so that the piezoelectric elements 102 are securely attached near the outer periphery 120 of the first support structure 114. Alternatively, the fixed ends 105 can be affixed to the first support structure 114 by an appropriate fastener or adhesive.

Figure 15:
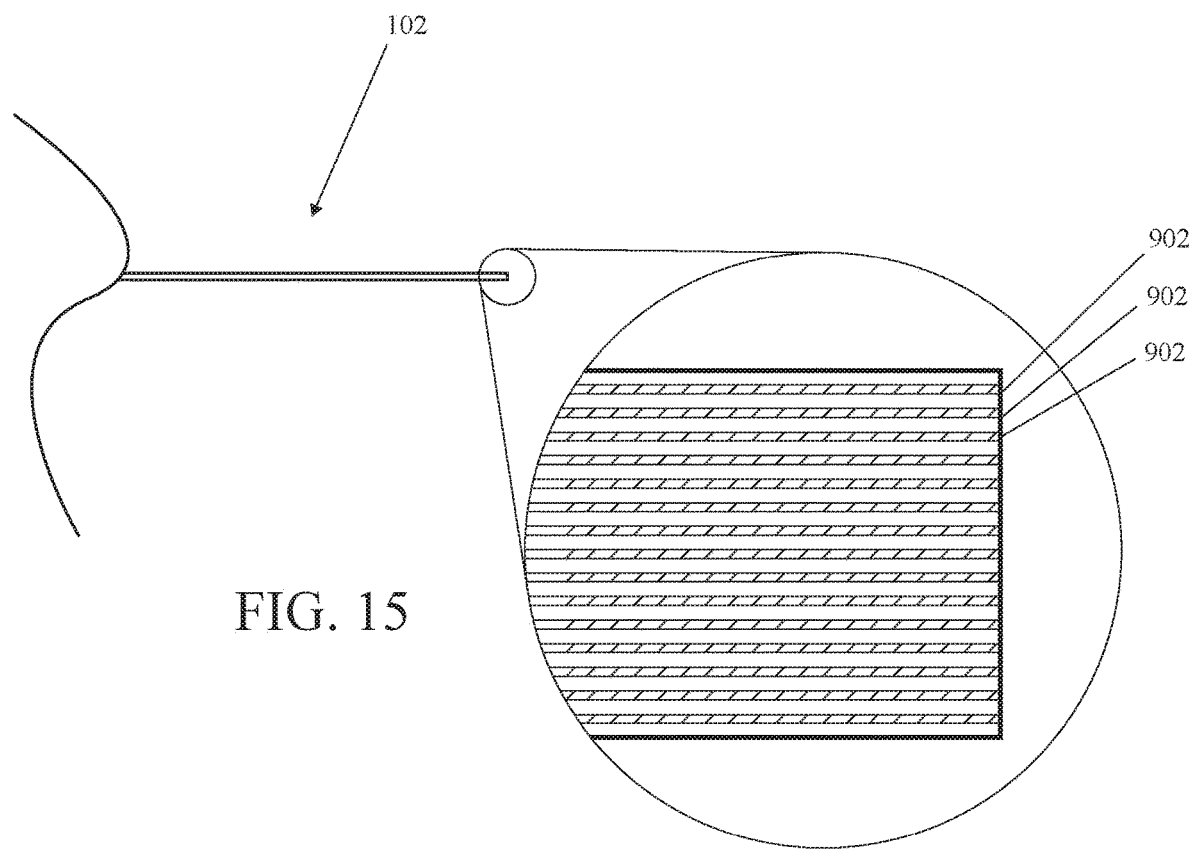
FIG. 15 is an up-close view of a version of the piezoelectrical element having sub-elements.
Figure 16:
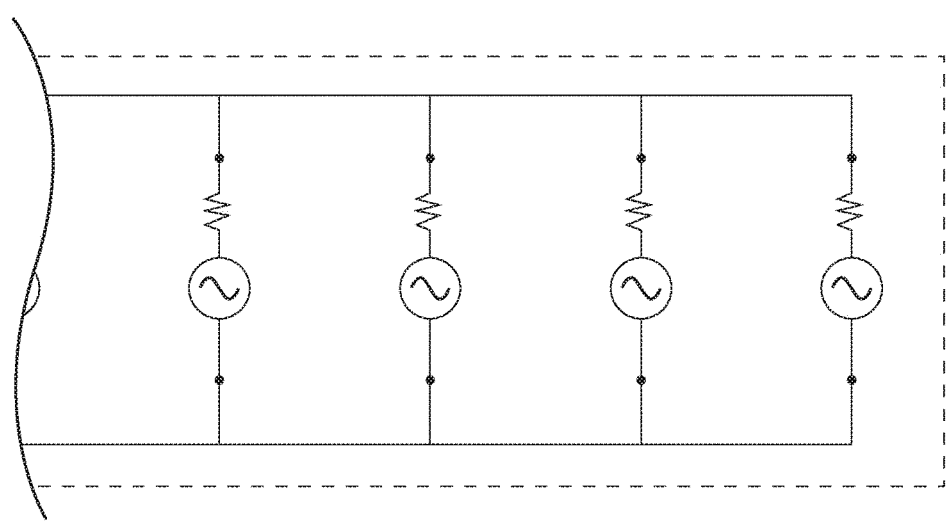
FIG. 16 is a schematic view illustrating the sub-element of the version shown in FIG. 15 connected in a parallel circuit.

In a detailed version of the cantilever style piezoelectric reed 102, FIG. 15 illustrates a cantilever piezoelectrical element 102 having a horizontally layered structure comprising a plurality of piezoelectric sub-elements 902 which capitalizes upon shearing movement of the piezoelectric element 102. Each sub-element 902 producing an electrical charge and operably connected in parallel with the other sub-elements 902 as shown in FIG. 16. For reasons discussed below, the circuit connecting a plurality of sub-elements 902 in the parallel will reduce the overall impedance and resistance of the individual piezoelectric elements included in the electrical conduction system 106.

Figure 3:
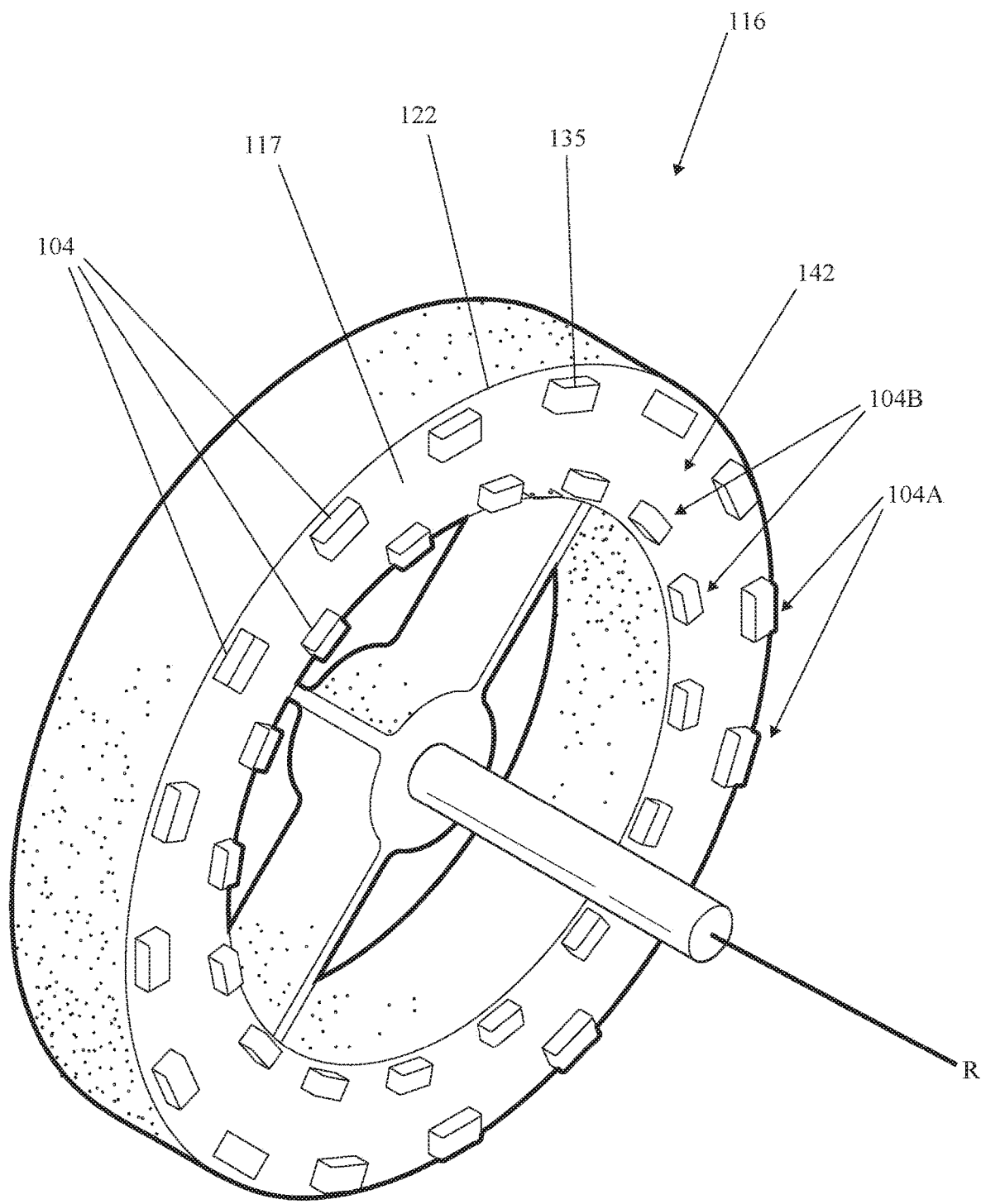
FIG. 3 is a perspective view of the second support structure of the version shown in FIG. 1.
Figure 4:
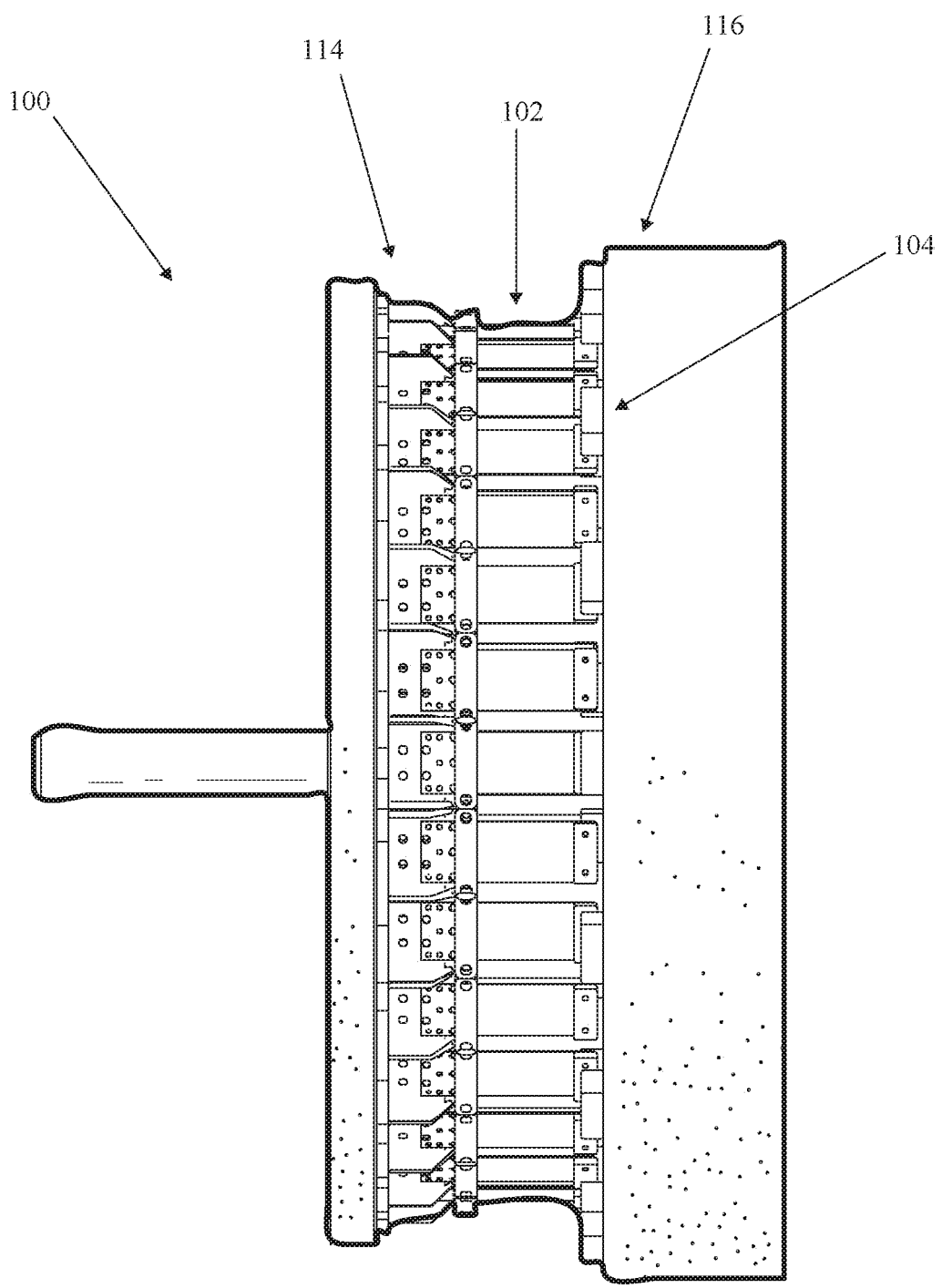
FIG. 4 is a side elevation view of the version shown FIG. 1.

Referring to FIG. 3, at least one and preferably all of the plurality of actuators 104 comprise at least a first magnetic material or a material 135 that exhibits properties of magnetism. Ideally, the magnets 135 are mounted so that they protrude towards the path of the piezoelectric elements 102, particularly aligned to interact with the path of the magnetic material or ferrous material 136 passing adjacent thereto during operation which will be described in a detailed version below.

By way of overview, referring back to FIG. 2, the piezoelectric elements 102 are arranged in a predefined pattern. The piezoelectric elements 102 are radially aligned, extending from the radial attachment surface 115 and equally distributed in a circular or radial pattern about the R longitudinal axis near the outer periphery 120 of the first support structure 114. Correspondingly, the plurality of actuators 104 are radially aligned and equally distributed in a circular or radial pattern about the R axis near the outer periphery 122 of the second support structure 116 (See FIG. 3). Therefore, as the rotary drive shaft 128 imparts rotation to the second support structure 116 about the longitudinal axis R, each actuator 104 passes a corresponding piezoelectric element 102 in a simultaneous manner, interacting and exciting each piezoelectric element 102 forming a collective electrical output.

In particular, while the piezoelectric generator 100 is operating, each piezoelectric element 102 flexes in a lateral direction when the ferrous mass 136 located at the free end 108 is displaced by the presence of a corresponding magnetic actuator 104 as it passes by. Thus, providing a distorting movement of the structure of the piezoelectric element 102 which produces an electrical output.

"Exciting" or "excitation" of a piezoelectric element 102 involves contacting, striking, compressing, or otherwise imparting deformation or kinetic movement of the piezoelectric element 102 at the free region 103 sufficient to harvest an electric current therefrom. Preferably the rotational speed of the second support structure 116 supporting the actuators 104 is established or chosen to permit an optimal excitation response from the plurality of piezoelectric elements 102 in the subset.

The dimension and shape of the piezoelectrical element 102 may vary between application in order to effectively produce an electrical current. The resonance frequencies of each piezoelectrical element 102 can be adjusted by tailoring the width, thickness, and length, etc. In the example version, the piezoelectrical element 102 is cantilever in nature having a rectangular plan view. Other shapes and dimensions can certainly be utilized in order to produce an effective electrical output.

In the example version 100 as detailed in FIG. 1, the predefined patterns of the piezoelectric elements 102 and the corresponding predefined patterns of the actuators 104 provide a continuous alternating pattern variation which harvests at least a first subset S1 and second subset S2 of stimulated piezoelectric elements 102 producing a first and second electrical output phase.

In the example version of FIG. 3, the predefined pattern of a plurality of actuators 104 comprises of a first series of actuators 104A and a second series of actuators 104B. The first and second series of actuators 104A, 104B are fixedly attached to the second support structure 116 radial attachment surface 117, the first series of actuators 104A forming an outer ring shape near the outer periphery 122 and the second series of actuators 104B configured to form an inner ring concentric to that of the first series of actuators 104A. The first series of actuators 104A and the second series of actuators 104B form and define a concentric pathway 142 therebetween, the concentric pathway 142 dimensioned to receive and nest the free end 108 with ferrous mass 136 throughout its path of travel during operation.

Figure 20:
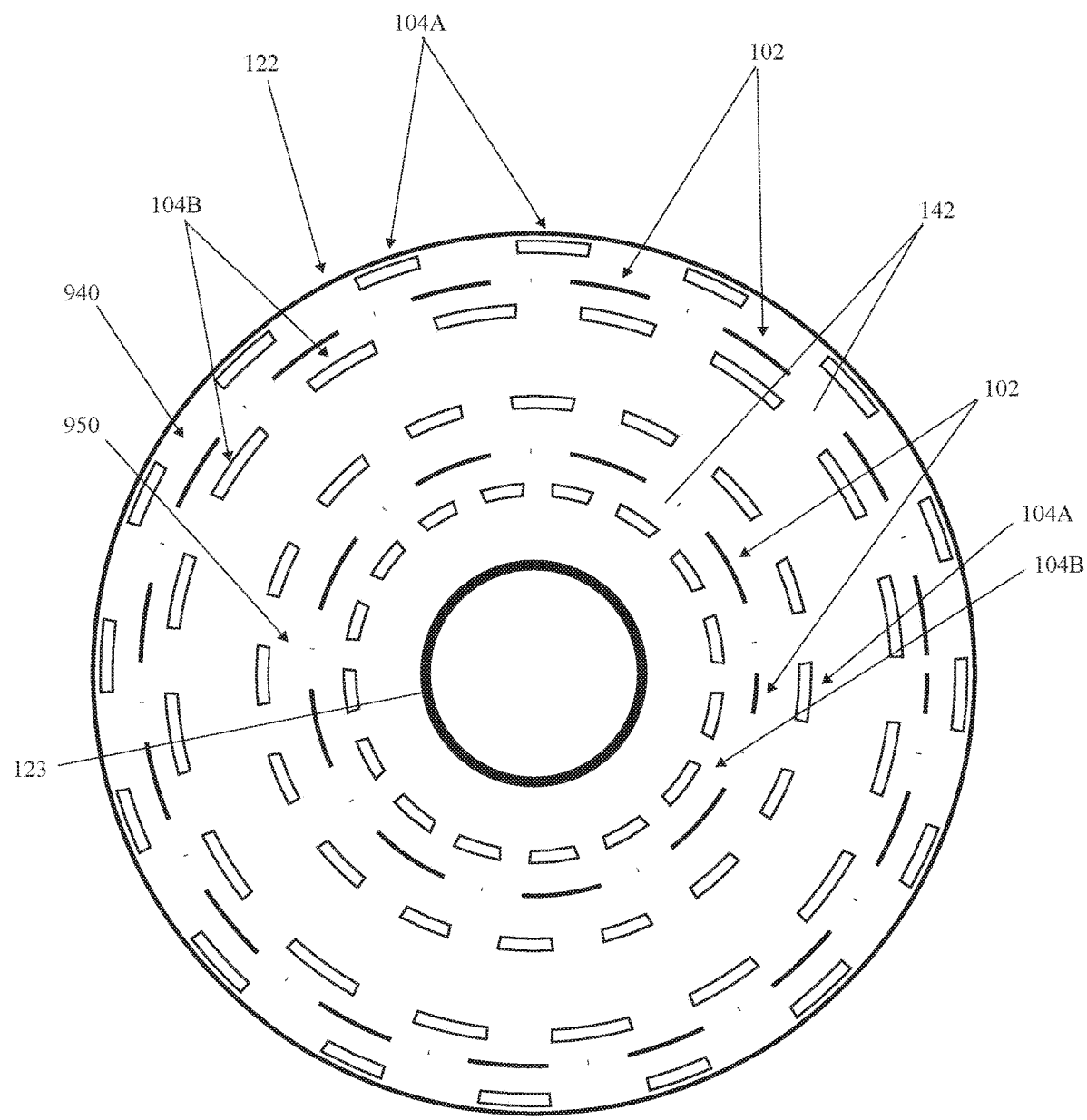
FIG. 20 is a diagram of an example pattern of concentric bands of interacting piezoelectric elements and actuators.

As best illustrated by the pattern shown in FIG. 20, the piezoelectric power generator 100 may have more than one ring of piezoelectric elements 102 aligned in a radial manner associated with a first and a second series of actuators 104A, 104B, collectively forming bands. Thus, for purposes of example, FIG. 20 illustrates a cross-sectional view showing a first band 940 of elements formed near the outer periphery 122 and a concentric second band 950 of elements formed near the interior periphery 123 of the radial structures 114, 116.

With specific reference to FIG. 3, the first series of actuators 104A are intermittently spaced at a first angular distance apart. The inner, second series of actuators 104B, is concentrically aligned, yet off set to provide an alternating pattern between the outer, first series of actuators 104A and the inner, second series of actuators 104B. For example, the inner second series of actuators 104B would be offset by half of the first angular distance, affording an alternating pattern between individual actuators 104 of the first and second series of actuators 104A, 104B.

Figure 5:
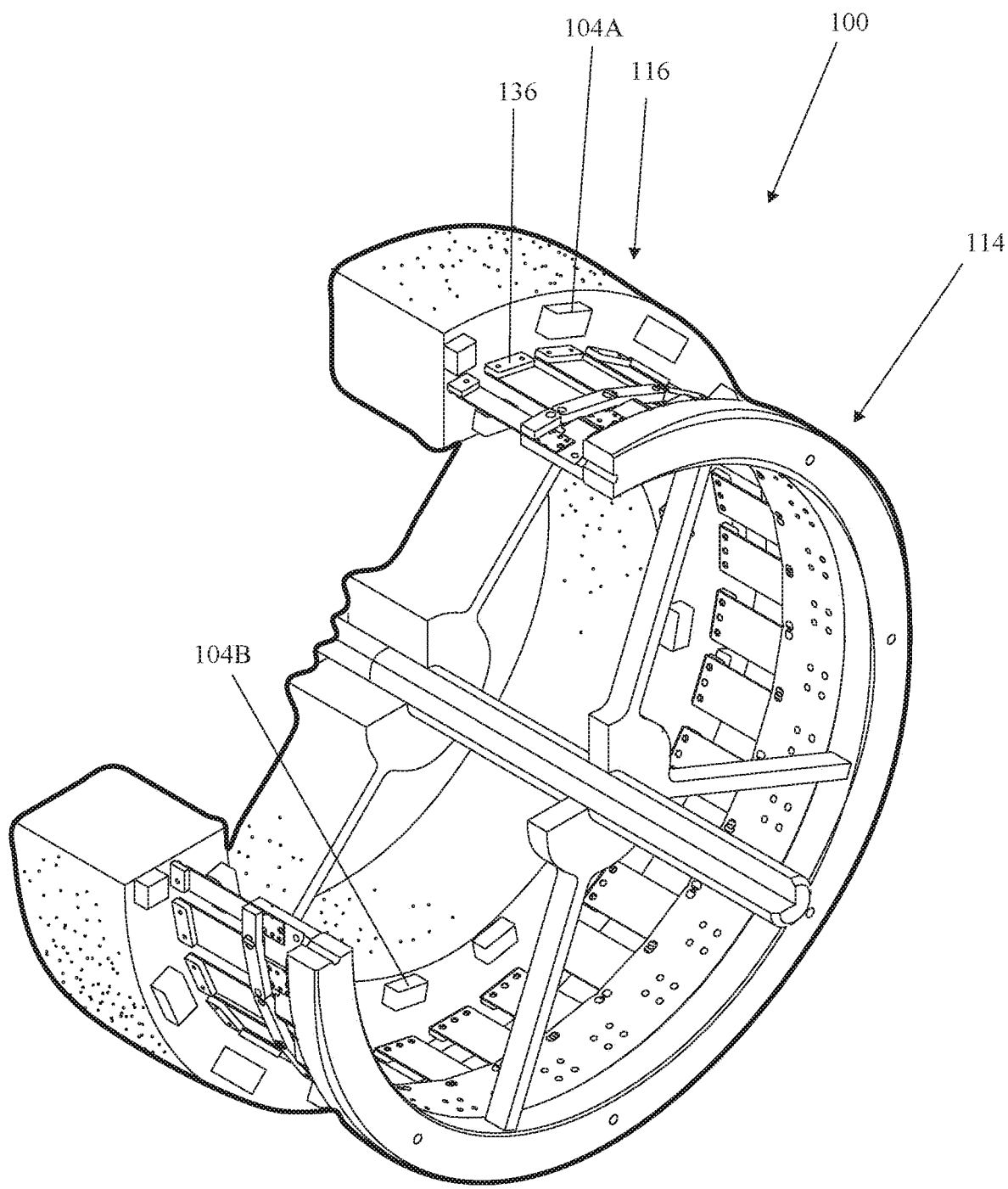
FIG. 5 is a perspective cutaway view of the version shown in FIG. 1.
Figure 10A:
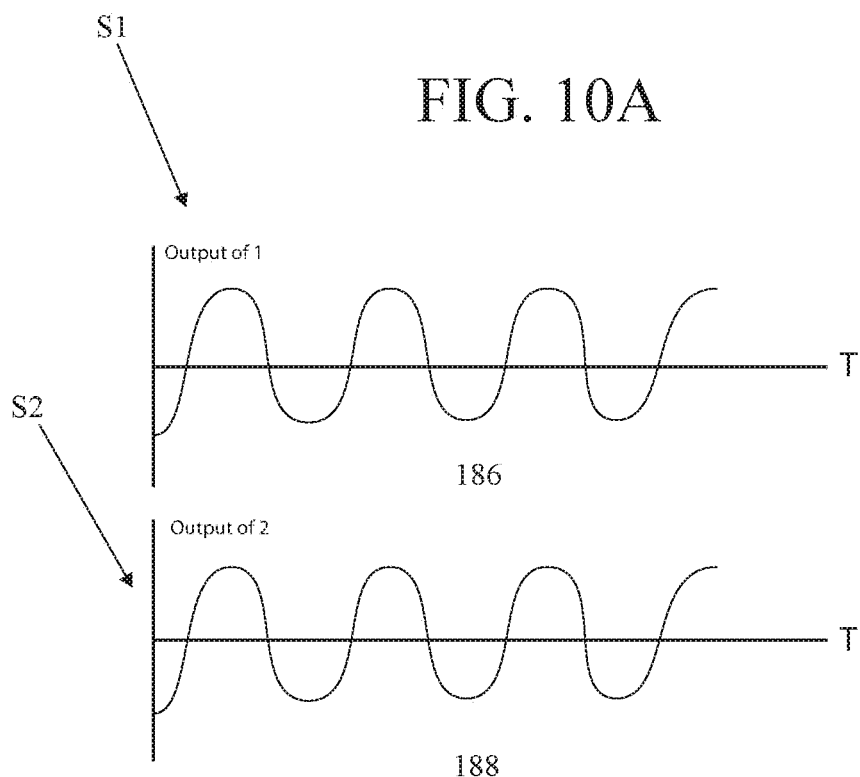
FIG. 10A is a graph showing an output wave of each piezoelectric element subset electrical output phase.
Figure 11A:
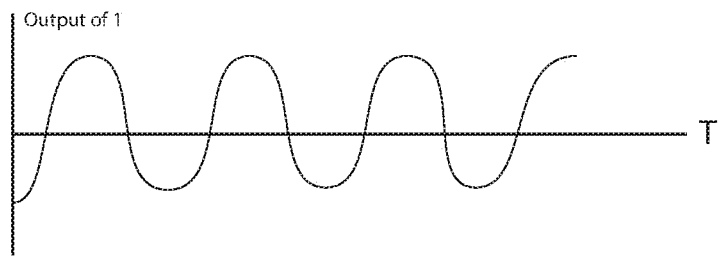
FIG. 11A is a graph showing an output wave of each piezoelectric element subset electrical output phase.

Now referring to both FIG. 5 and FIG. 6A, the motion of an individual piezoelectric element reed 102 will now be described in spatial relation to the actuators 104 during operation. As the piezoelectric element reed 102 moves through the circular path of motion relative to the actuators 104, the nested free end 108 containing the ferrous mass 136, moves along the concentric pathway 142 encountering laterally alternating offset series of magnetic actuators 104. As the free end 108 encounters a first laterally positioned actuator 104A, the magnetic force attracts the ferrous mass 136, displacing the free end 108 in a first lateral direction (See FIG. 6A, Position 1), thereby flexing in a first lateral direction. Thus, interacting and exciting the piezoelectric element 102 inducing an electrical current. Thereafter, as the piezoelectric element 102 continues to move through the forward path of motion along the concentric pathway 142, the piezoelectric element 102 encounters the following laterally positioned actuator 104B of the opposing series of actuators, the magnetic force attracts the ferrous mass 136, displacing the free end 108 in an opposite second lateral direction (See FIG. 6A, Position 2), thereby flexing in a second lateral direction. Thus, again, interacting and exciting the individual piezoelectric element 102 inducing a second electrical charge. The phase of the lateral path of motion of the piezoelectric element 102 is thereby controlled and limited by the pattern of the alternating series of actuators 104A, 104B throughout the concentric pathway 142 of motion. FIG. 10A and FIG. 11A illustrate the electrical output over time of an individual piezoelectric element 102 through its lateral path of motion.

Figure 8A:
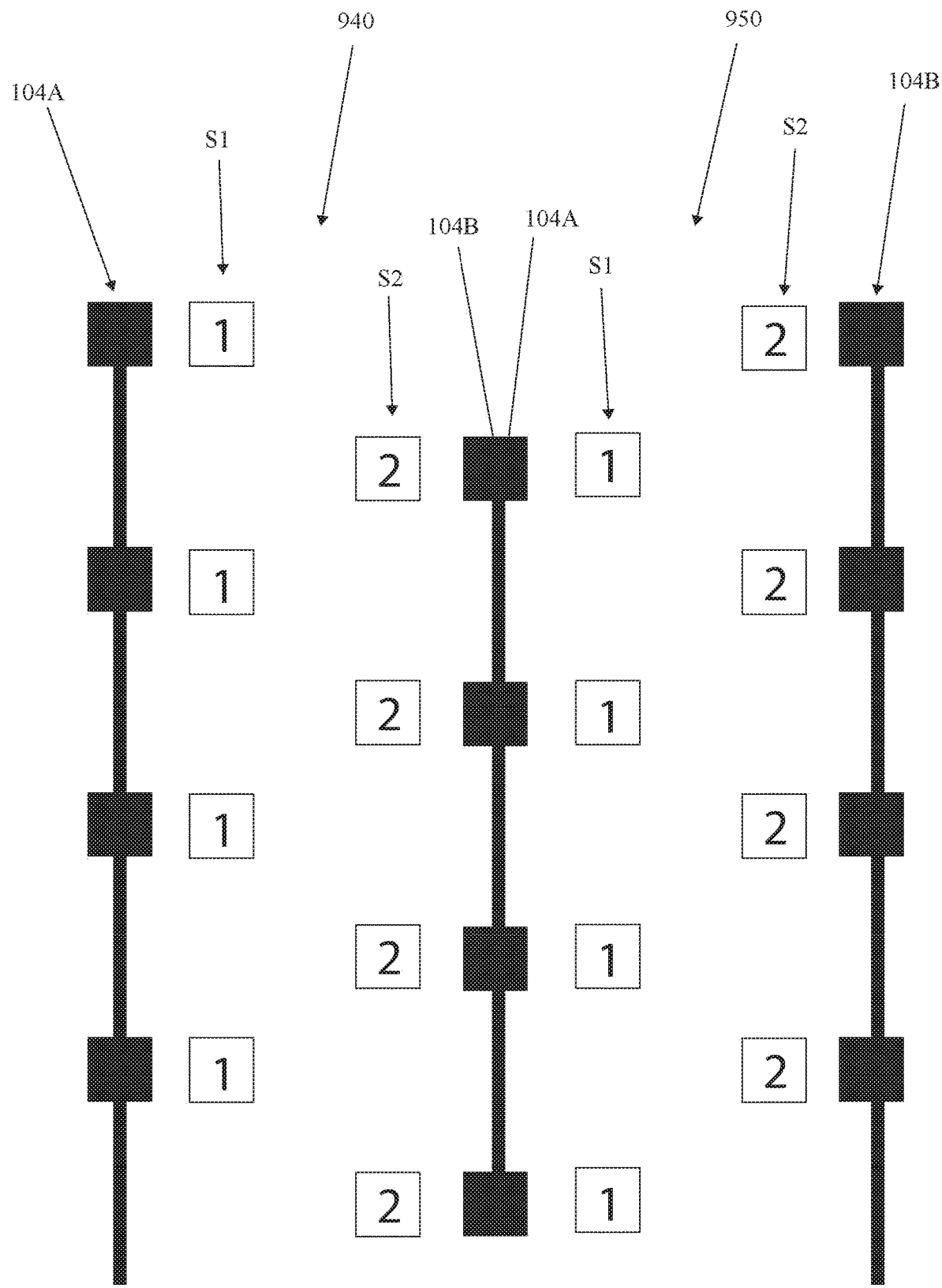
FIG. 8A is a diagram illustrating movement of a first subset and a second subset of piezoelectric elements throughout a path of motion.
Figure 8B:
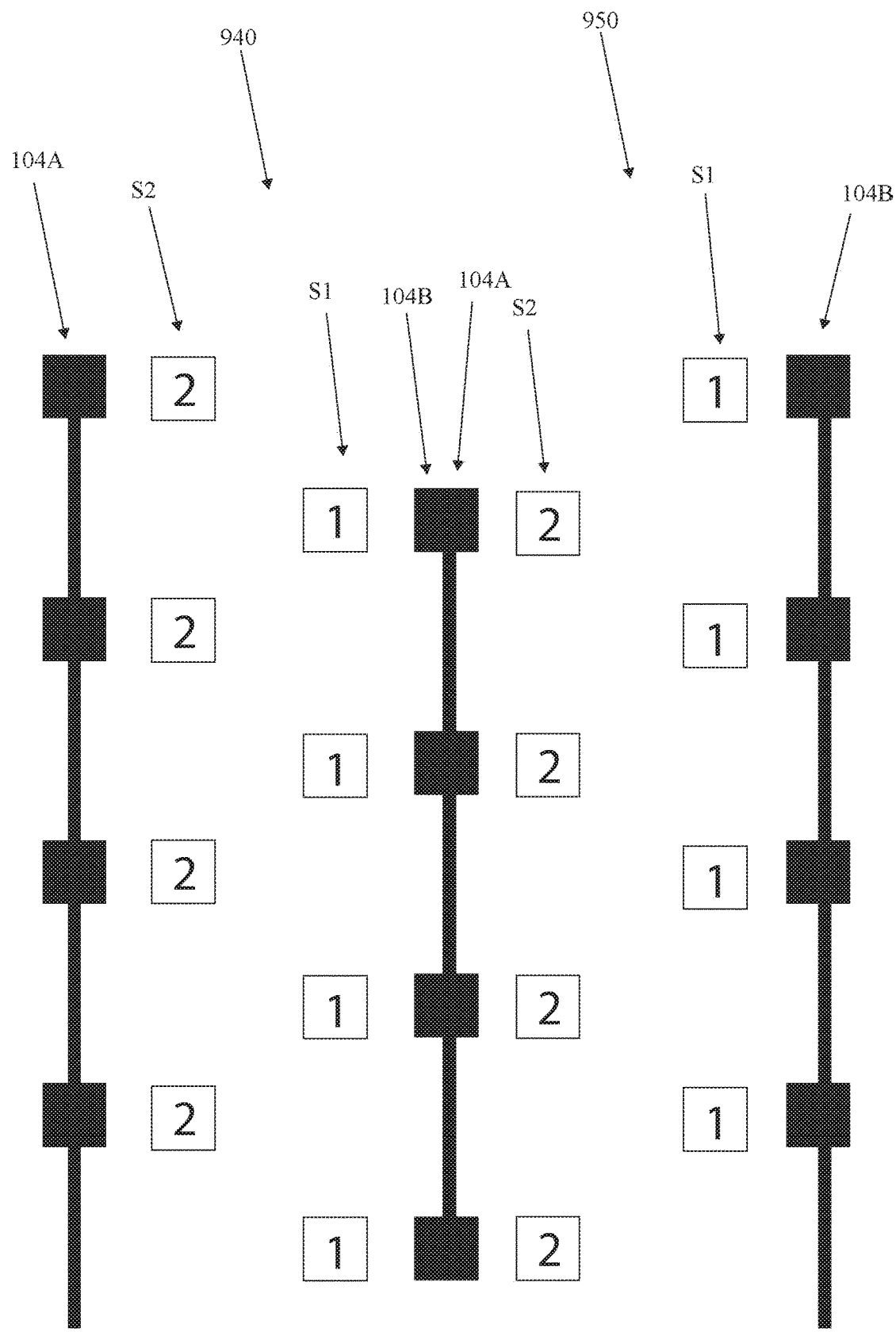
FIG. 8B is a diagram illustrating movement of a first subset and a second subset of piezoelectric elements throughout a path of motion.

Now with specific reference to FIG. 8A-8B and FIG. 9A-9C, the motion of a plurality of piezoelectric elements 102 sequentially aligned will be explained in detail. The figures illustrate a series of piezoelectric elements S1, S2 as they move through their forward path of motion encountering the first series of actuators 104A and the laterally opposing second series of actuators 104B. FIGS. 8A and 8B is a diagram illustrating a piezoelectric power generator having a first band of elements 940 and a second concentric band of elements 950.

Figure 9A:
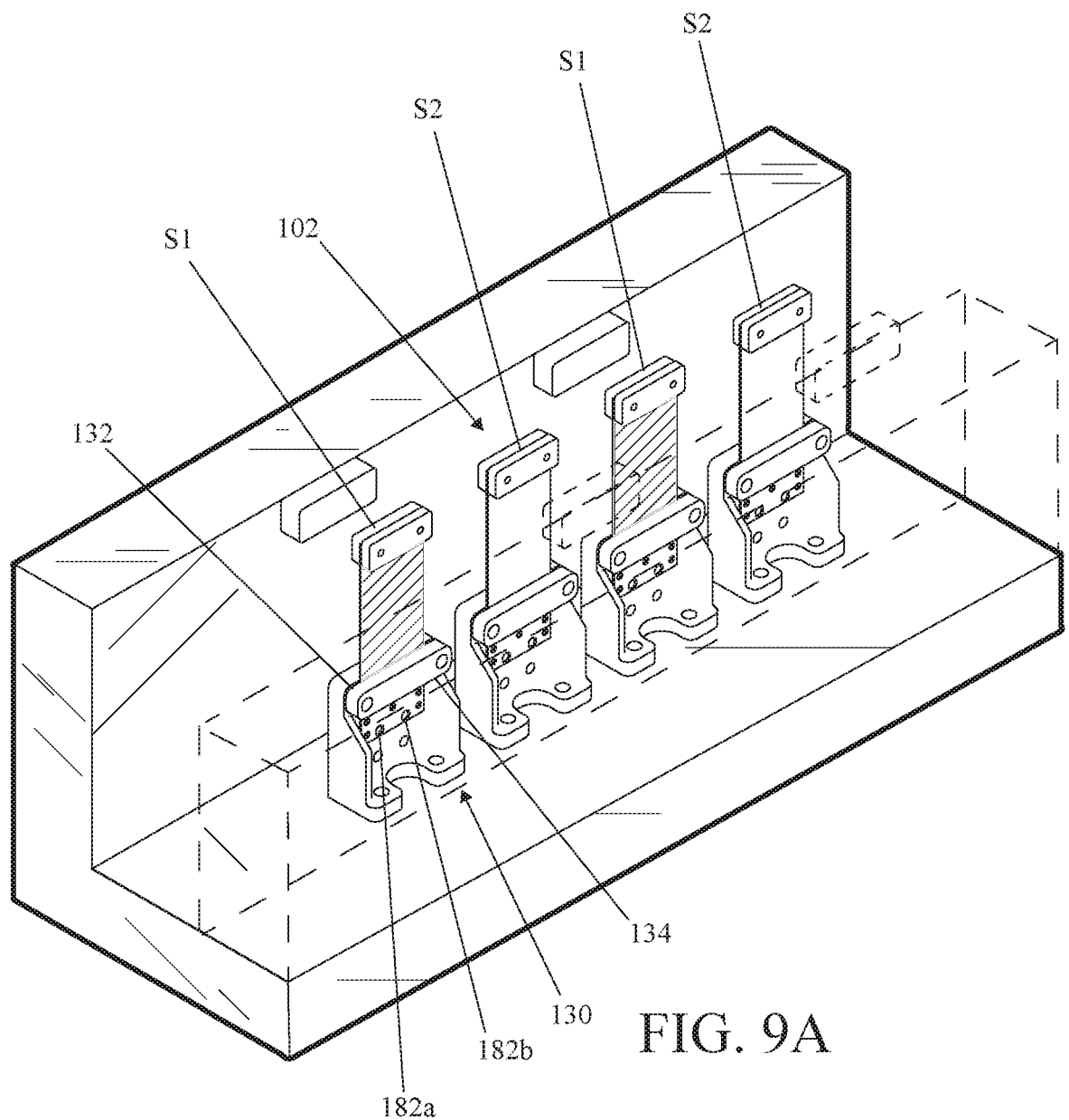
FIG. 9A is a perspective view of a series of piezoelectric elements while in a neutral position.

FIG. 9A illustrates a series of four piezoelectric elements 102 shown in a neutral, default position. The series of piezoelectric elements 102 comprise at least two subsets, a first subset S1 and a second subset S2. The first subset S1 comprises the odd numbered piezoelectric elements 102 in the series and the second subset S2 comprises the even number of piezoelectric elements 102 in the series. Thus, the first subset S1=[2n+1] and second subset S2=[2n].

Figure 9B:
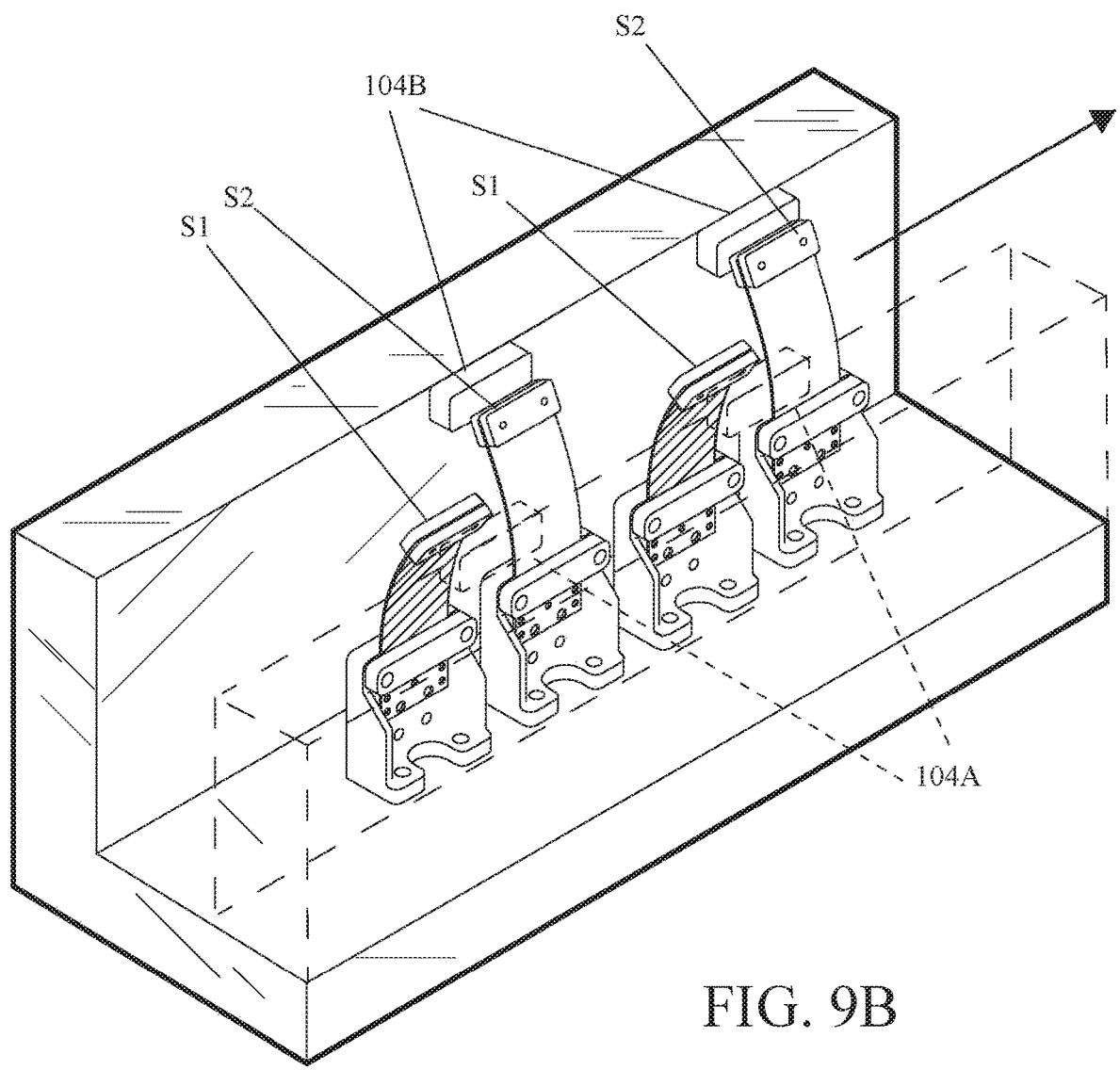
FIG. 9B is a perspective view of a series of piezoelectric elements while in a first subset position and a second subset position.
Figure 9C:
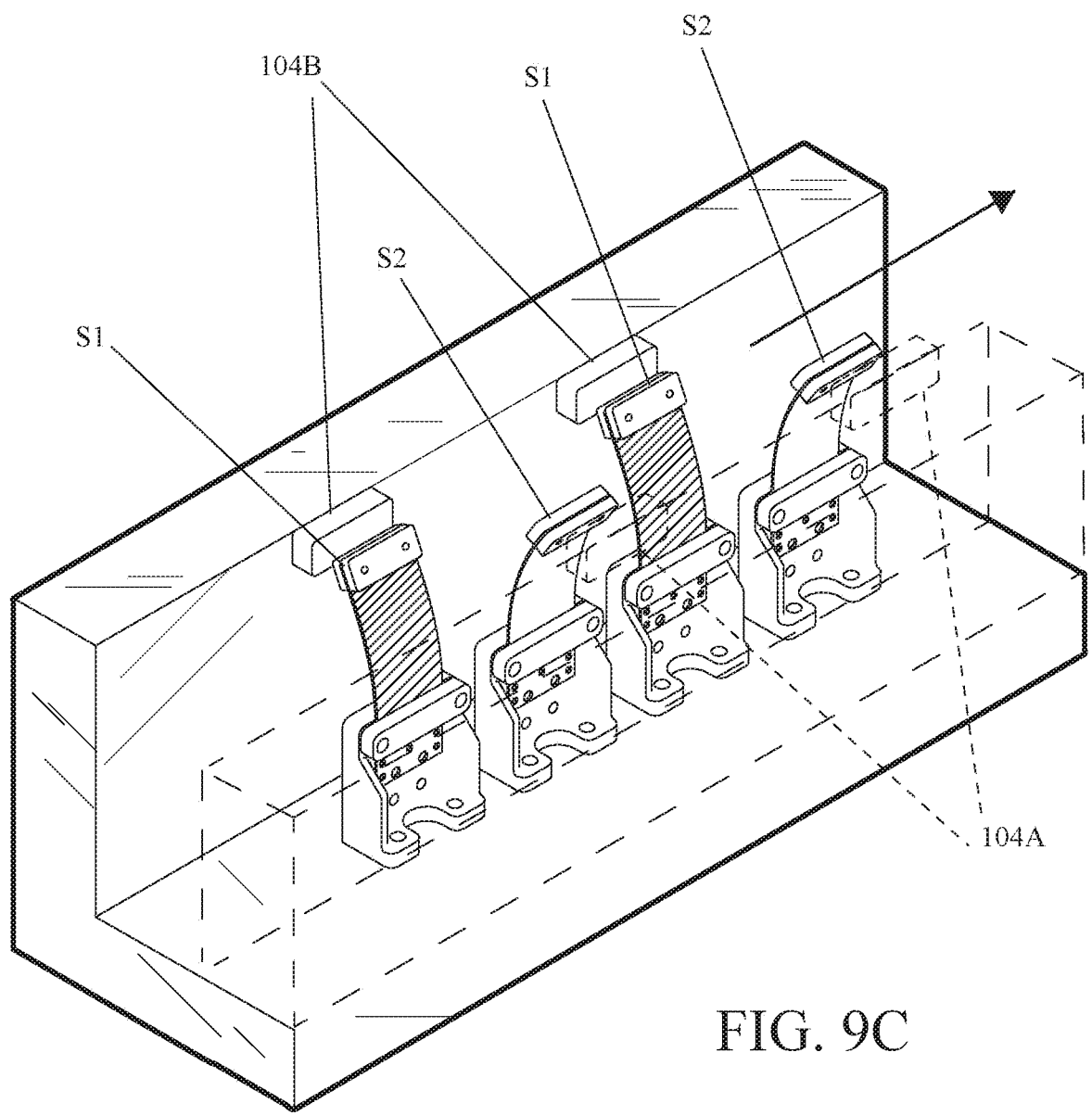
FIG. 9C is a perspective view of a series of piezoelectric elements while in a first subset position and a second subset position.

Similar in nature to the motion of the individual piezo element 102 described above, each subset S1, S2 of the piezoelectric elements 102 laterally move in a synchronous motion throughout a fully cycle. As the plurality of piezoelectric elements 102 move through the concentric pathway 142 relative to the first and second series of actuators 104A, 104B, each piezoelectric element 102 subset S1, S2 encounters the opposing series of actuators simultaneously. As best illustrated by FIG. 9B, in a first phase, the first subset S1 of the series of piezoelectrical elements 102 is displaced towards the first series of actuators 104A and the second subset S2 of the series of piezoelectrical element 102 is displaced towards the second series of actuators 104B simultaneously. Referring to FIG. 9C, in a second phase, as the series of piezoelectric elements 102 move forward through the forward path of motion, each subset S1, S2 lateral moves towards the opposing series 104A, 104B of actuators in an oscillating manner. Thus, the first subset S1 of the series of piezoelectrical elements 102 is displaced towards the second series of actuators 104B and the second subset S2 of piezoelectric elements 102 is displaced towards the first series of actuators 104A. Therefore, as the plurality of piezoelectric elements 102 move through the path of motion relative to the actuators 104, an oscillating movement between each series of actuators 104A, 104B is established for each subset S1, S2 simultaneously.

Therefore during operation, each subset S1, S2 encounters opposing corresponding series of actuators 104 throughout a complete cycle comprised of two phases, laterally flexing each piezoelectric element 102 in phase with the subset. Therefore, interacting and exciting each piezoelectric element 102 in its subset simultaneously, which collectively produces a first electrical output phase (See FIG. 10A, S1) produced from the first subset S1 and a second electrical output phase (See FIG. 10A, S2) produced from the second subset S2 of piezoelectric elements 102. This alternating pattern may oscillate indefinitely throughout the cycle of motion of the piezoelectric elements 102 relative to the actuators 104.

Figure 13:
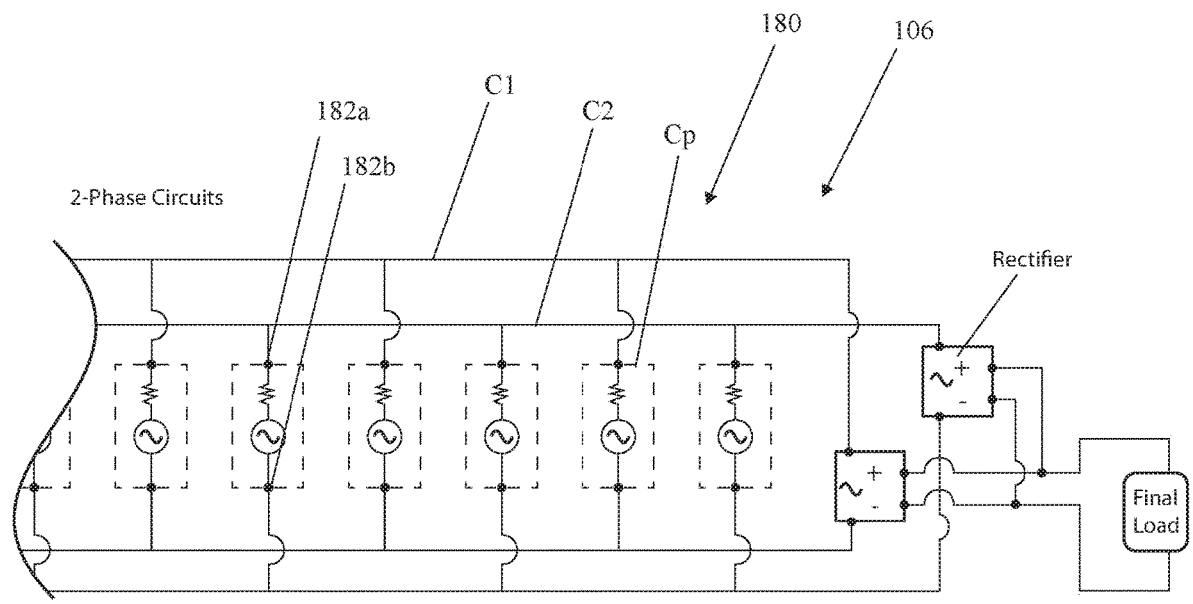
FIG. 13 is a schematic view of a first example electrical circuit utilized in an electrical conduction system of the piezoelectric power generator.

Referring now to FIG. 10-FIG. 14, an example electrical conduction system will be explained. Generally, the electrical conduction system 106 comprises a plurality of circuits connected to sum a an electrical current produced by the piezoelectric elements 102 throughout each cycle of each subset and provide an overall electrical current produced by the piezoelectrical power generator 100. Referring to FIG. 13, generally, a two-phase circuit 180 is provided which is operably configured to sum a first electrical current produced by the first subset S1 of the piezoelectric elements 102 via subcircuit C1 and sum a second electrical current produced by the second subset S2 of the piezoelectric elements 102 via subcircuit C2, and sum a electrical current produced by all subsets including the first and second subsets S1, S2 collectively in order to conduct and provide an overall electrical current produced by the piezoelectric power generator 100.

Figure 14:
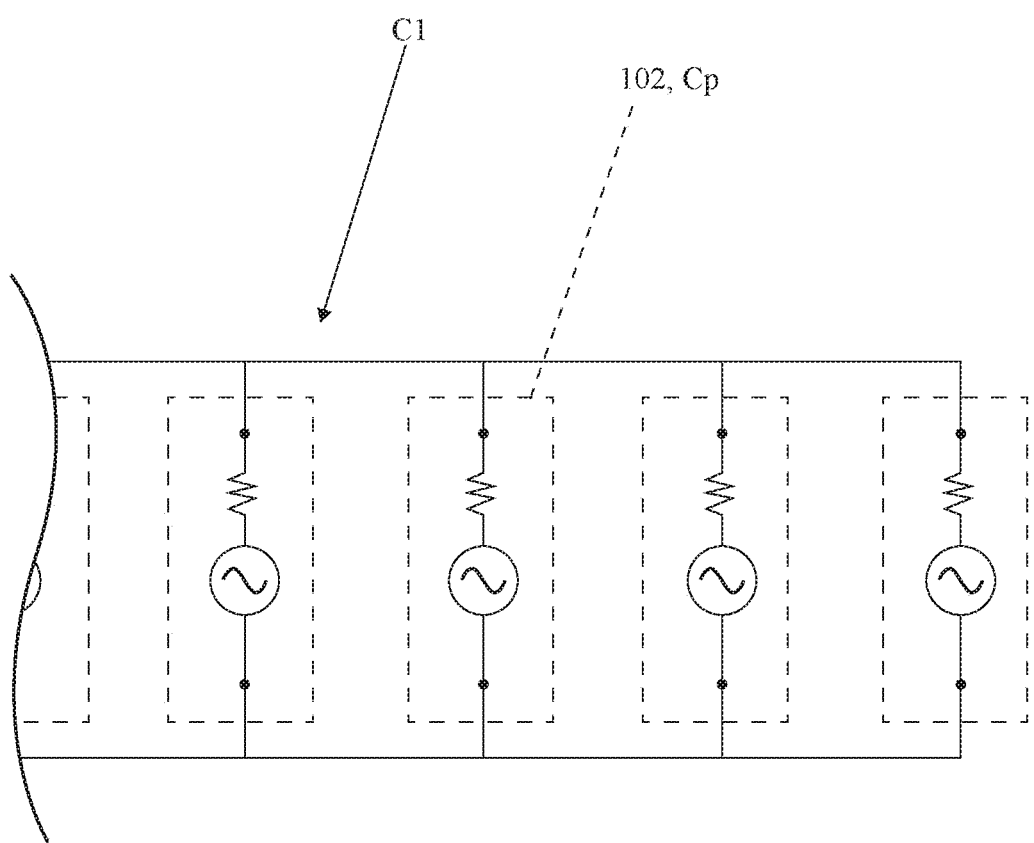
FIG. 14 is a schematic view illustrating the piezoelectric elements connected in a parallel circuit.

Each piezoelectric element 102 (FIG. 12) has dual electric leads 182a, 182b for connecting each piezoelectric element 102 to the requisite subset S1, S2 circuitry C1, C2 (FIG. 13). The dual electric leads 182 are typically positioned at the fixed end 105 of each piezoelectric element 102 (FIG. 9), each engaging the subset circuitry C1, C2 at the mounting bracket 130 via the slot 132. Preferably, each piezoelectric element 102, Cp in each subset circuit C1, C2 is operably connected in parallel (See FIG. 14 illustrating a plurality of piezoelectric elements wired in parallel circuit). However, each circuit C1, C2 can be configured in series in the alternative. As illustrated in FIG. 13, all piezoelectric elements 102 in the first subset S1 are operably connected in parallel via subcircuit C1 and all of the piezoelectric elements 102 in the second subset S2 are operably connected in parallel via circuit C2. Ideally, the subcircuit C1 and subcircuit C2 are operably connected in parallel providing and overall electrical charge output of the piezoelectric power generator 100.

Ideally, parallel circuits are utilized when possible within the electrical conduction system 106. By way of background, electrical internal impedance is the measure of the opposition that a circuit presents to a current when a voltage is applied. In quantitative terms, it is the complex ratio of the voltage to the current in an alternating current (AC) circuit. Preferably, in order to improve the efficiency of the overall electrical conduction system 106 by lowering the overall electrical impedance of the circuit, parallel circuits are utilized to connect the piezoelectrical elements 102. Each piezoelectric element shown in FIG. 14 models as an ideal voltage source combined with a measurable level of resistance Ri. In order to calculate the overall resistance in any parallel circuit Rt, the following formula is utilized:

$$1/Rt = 1/R1 + 1/R2 + 1/R3 \ldots 1/Rn$$

Assuming Ri is constant and represents the internal resistance of an individual piezoelectric element 102, solving for Rt provides:

$$Rt = Ri/n$$

Thus, as the number n of piezoelectric elements 102 connected in parallel increases, the overall circuit impedance Rt will decrease, allowing for more efficient power transfer to the end electrical load.

Referring to FIG. 10A, as an illustrative example, the first output graph 186 shows the current over time of the first subset S1 piezoelectrical elements 102 oscillating in phase and the second output graph 188 shows the current overtime of the second subset S2 of the piezoelectrical elements 102 oscillating in phase. Throughout the cycle of each subset S1, S2 of the piezoelectric elements 102, the voltage overtime cycles between a positive voltage and a negative voltage.

Figure 10B:
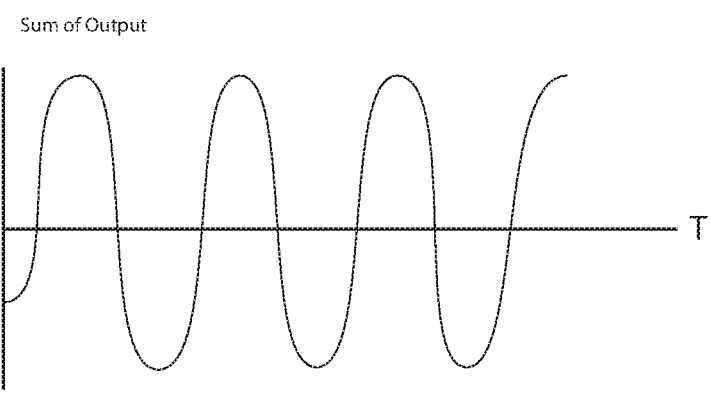
FIG. 10B is a graph showing an output wave of a sum of each piezoelectric element subset electrical output phase.
Figure 11B:
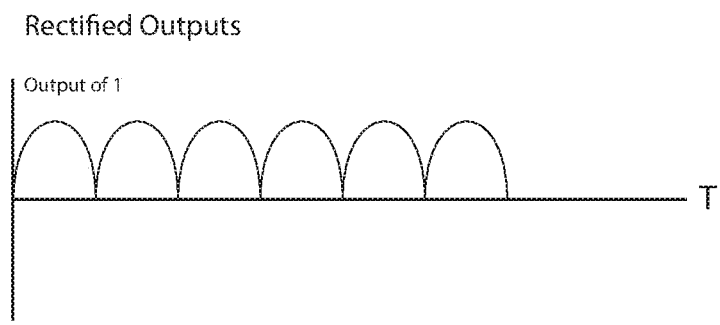
FIG. 11B is a graph showing an output wave of a sum of each piezoelectric element subset electrical output phase utilizing a rectifier.
Figure 11C:
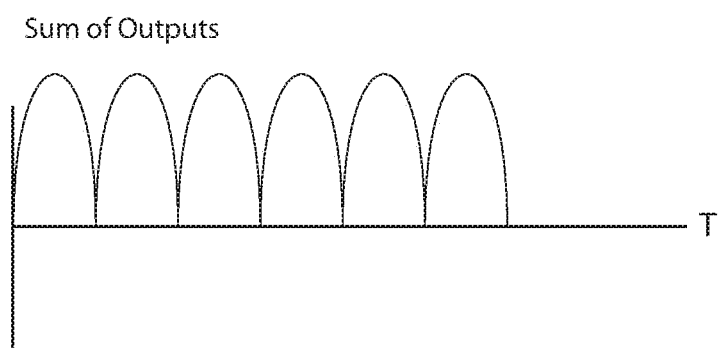
FIG. 11C is a graph showing an output wave of a sum of the rectified output waves of FIG. 11B.
Figure 12:
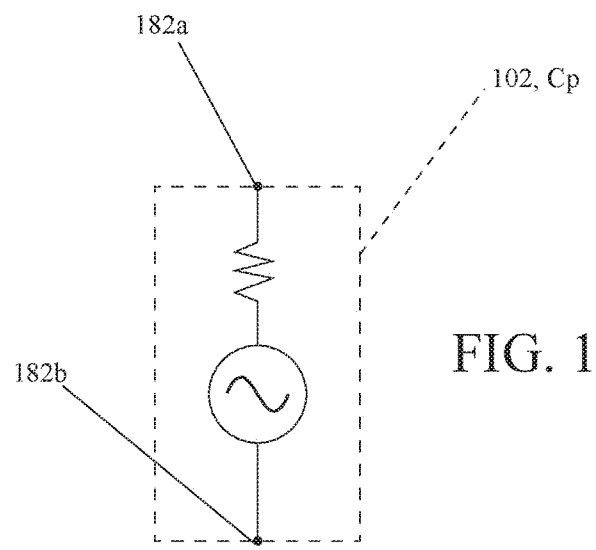
FIG. 12 is a schematic view of an individual piezoelectrical element circuit.

Ideally, the poles of the piezoelectric elements 102 in the first subset S1 are reciprocally aligned to the poles of the piezoelectric elements 102 of the second subset S2 or for simplicity, the lateral facing sides 110, 112 of the first subset S1 are oriented opposite of the lateral facing sides 110, 112 of the second subset S2. When the poles are aligned in this configuration, the output phase of each of the first subset S1 and the second subset S2 are aligned as illustrated in FIG. 10B and can thus easily be summed in order to provide an overall charge of the electrical conduction system 106 by combining both phases together in parallel circuit 180. Otherwise, each subcircuit S1, S2 may further comprise a rectifier 190 which will convert the alternating current into direct current as illustrated by FIGS. 11B and 11C.

Figure 17:
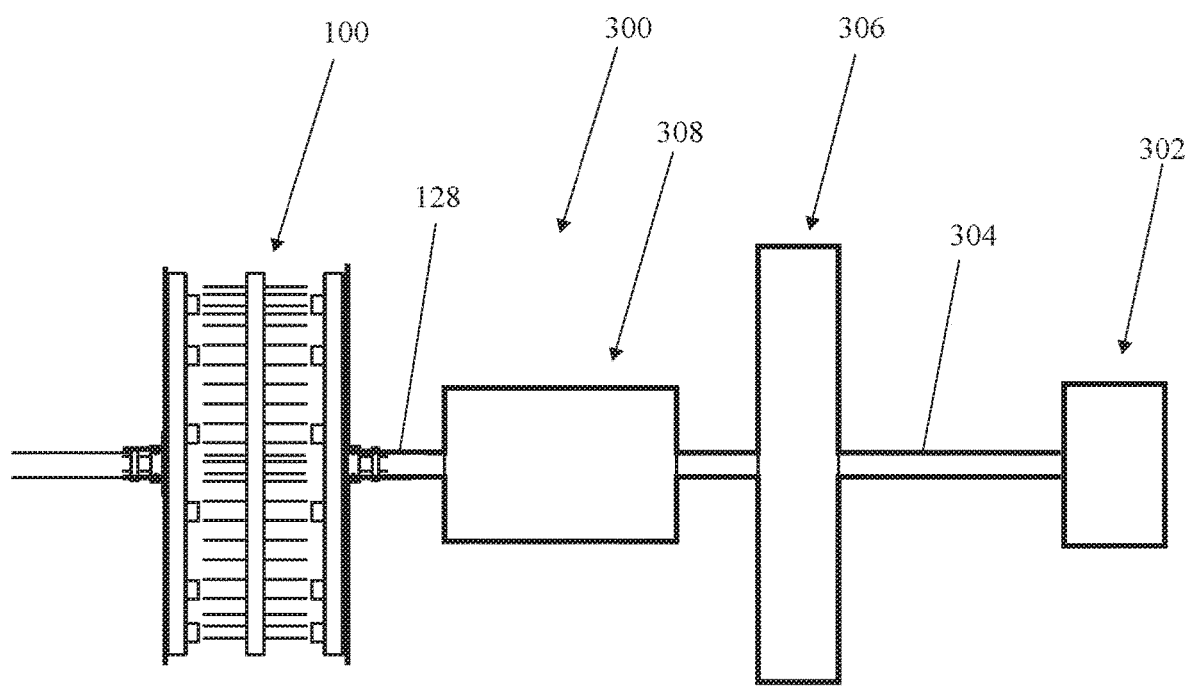
FIG. 17 is a block diagram of an example system utilizing a piezoelectric power generator.
Figure 18:
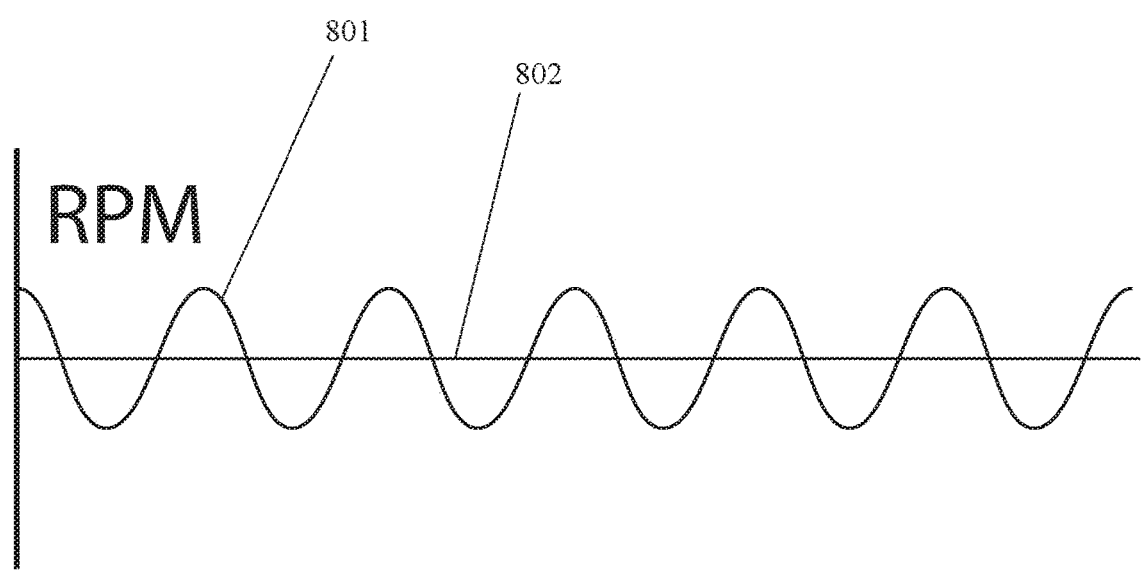
FIG. 18 is a graph showing an output wave of RPM over time of the input rotary drive shaft with the utilization of a flywheel and the CVT.
Figure 19:
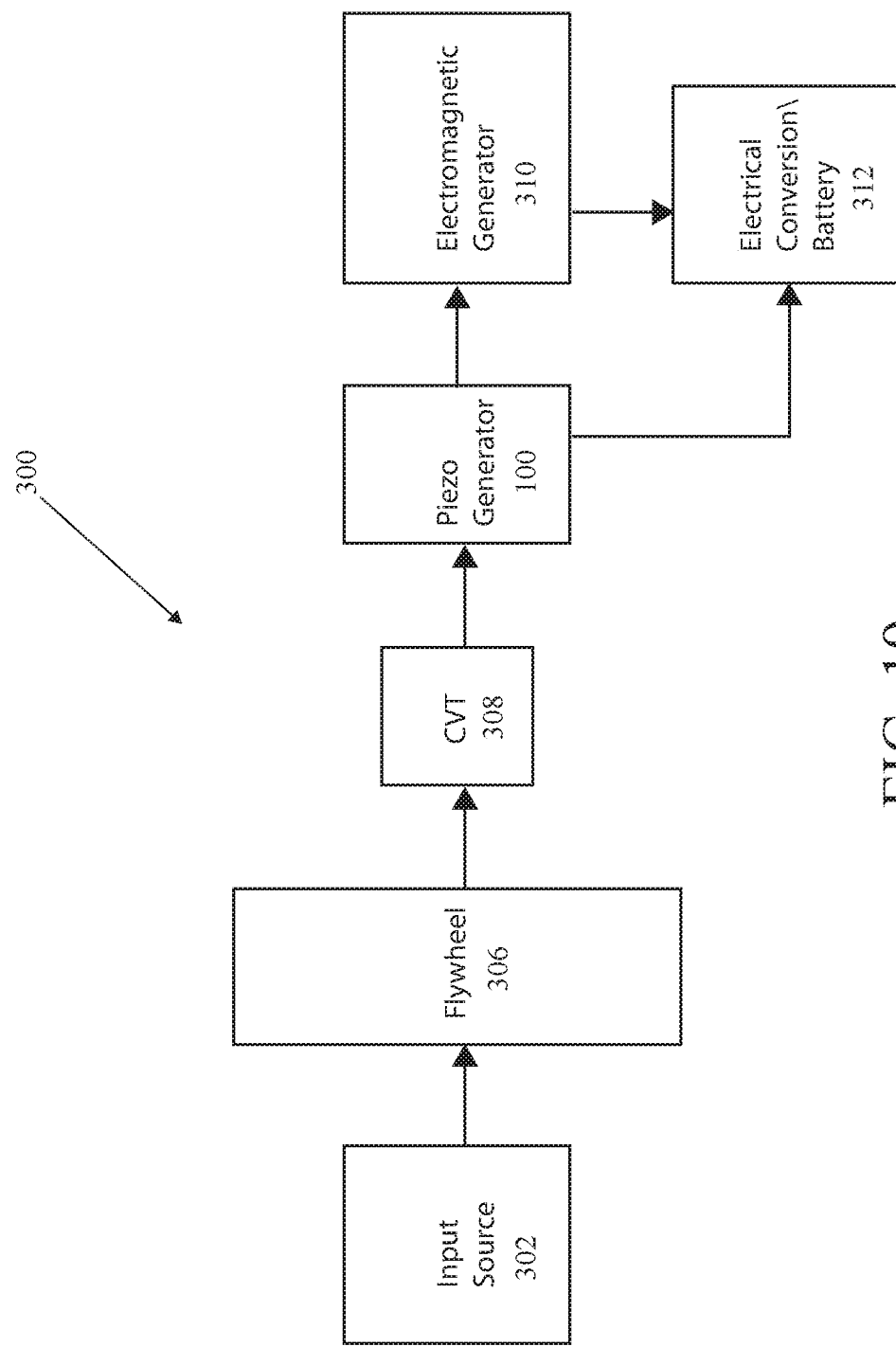
FIG. 19 is a flowchart of an example system utilizing a piezoelectric power generator.

Now referring to FIG. 17-FIG. 19, in particular, FIG. 17 is a block diagram showing an overview of an example piezoelectric power generator system 300 which provides and maintains kinetic energy to the piezoelectric power generator 100 in an efficient manner. In the example version, the system 300 comprises a motive device 302, an input rotary drive shaft 304, a flywheel 306, a continuously variable transmission 308 ("CVT"), a piezoelectric generator rotary drive shaft 128 and a piezoelectric power generator 100 previously described. The System 300 is defined as an illustrative example simulating components that may be optional, omitted or replaced by equivalent mechanisms.

In the example system 300, a motive device 302 is provided which generates a rotational force applied to the input rotary drive shaft 304. The motive device 302 can be any device which provides energy to the system 300. For example, the motive device 302 can take the form of a turbine, an internal combustion engine or other means, for example, a device that converts vehicular kinetic and potential energy into a rotational force of power.

The input rotary drive shaft 304 can be an elongated rod typically made of a strong material such as metal or other composite material for withstanding rotational forces about the longitudinal axis. The drive shaft connects the motive device 302 and the CVT 308. A flywheel 306 may be utilized in conjunction with the system 300. The flywheel 306 is a rotating mechanical device that is used to store rotational energy during operation. The flywheel 306 maintains a moment of inertia and thus resists changes in rotational speed. The flywheel 306 is ideal for providing a continuous level of energy when the motive device 302 or other energy source is discontinuous or intermittent. Ideally the flywheel 306 is positioned between the motive device 302 and the CVT 308.

The CVT 308 may be any transmission that is known in the current and future art which can convert rotational energy from the input rotary drive shaft 304 to the piezoelectric generator rotary drive shaft 128 seamlessly through a continuous range of effective gear ratios. Throughout operation of the system 300, the flywheel 306 will resist changes in rotational speeds, but will still have a varying RPM based on the input from the input rotary drive shaft 128 (See FIG. 18 801). The CVT 308 will be configured to convert the varying RPM of the input rotary drive shaft 304 into a fixed RPM so long as the flywheel 306 RPM is within a useable range (See FIG. 18 802). For example, the flywheel 306 rotational spin may vary between 1,000 RPM to 10,000 RPM. The CVT 308 will lock the RPM of the piezoelectric power generator 100 and rotary drive shaft 128 at 100 RPM while the flywheel 306 is operating between 1,000 RPM and 10,000 RPM. If the flywheel 306 drops below 1,000 RPM, the CVT 308 fails to provide adequate gear ratios and the piezoelectric power generator 100 RPM will fall below 100 RPM.

The piezoelectric generator rotary drive shaft 128 operably connects the CVT 308 with the piezoelectric power generator 100. The generator rotary drive shaft 128, similar to the input rotary drive shaft 304, is an elongated rod having a longitudinal axis which provides rotational kinetic energy from the CVT 308 to the piezoelectric power generator 100 within a preferred range of RPMs. In the example version of the piezoelectric generator 100 shown in FIG. 1, the generator rotary drive shaft 128 provides rotational force to the second support structure 116 for imparting rotational movement to the actuators 104 in order to excite the requisite piezoelectric elements 102.

FIG. 19 is a flowchart of an example system 300 utilizing a piezoelectric power generator 100. By way of overview, the piezoelectric power generator system 300 provides a motive device 302 which provides rotational energy to the input rotary drive shaft 304, further providing energy to the flywheel 306, which provides somewhat smoothed, but still variable, rotational RPMs to the CVT 308. The CVT 308 converting the rotational, varying RPM, energy from the input rotary drive shaft 304 seamlessly to a stable RPM of the piezoelectric generator rotary drive shaft 128, thereby providing rotational energy and powering the piezoelectric power generator 100 via supplying rotational energy to the second support structure 116.

It should be noted that this system can also be utilized in reverse, whereby an alternating electric charge is applied to the system, causing deflection of the piezoelectric elements 102, which in turn exerts a force on the actuators 104, inducing a rotation in the second support structure 116 and rotary drive shaft 128. In this utilization, the device is acting as a motor.

Moreover, the system 300 may further comprise an electromagnetic generator 310 or a means for storing energy such as a battery 312. The electromagnetic generator 310 or the battery 312 operably connected to the electrical conduction system 106 of the piezoelectric power generator 100 of system 300.

It will be known and advantageous to provide and interconnect—preferably in parallel circuitry—two or more operating piezoelectric power generators. In this regard, numerous, hundreds, if not thousands of piezoelectric power generators can provide power in unison to power a home, a street, or even a city with electrical energy.

Figure 21:
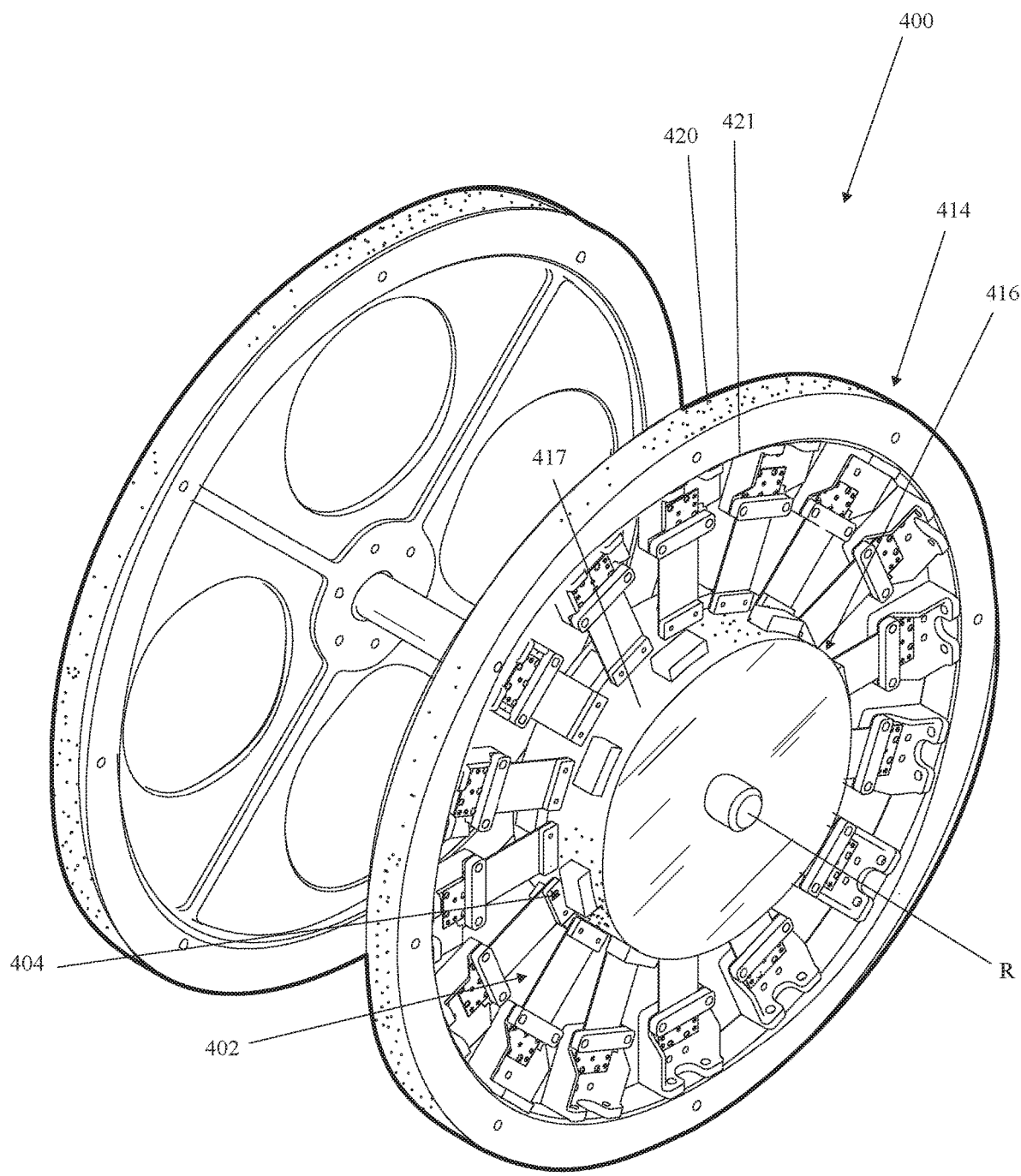
FIG. 21 is a perspective view of an alternative version of the piezoelectric power generator.
Figure 22:
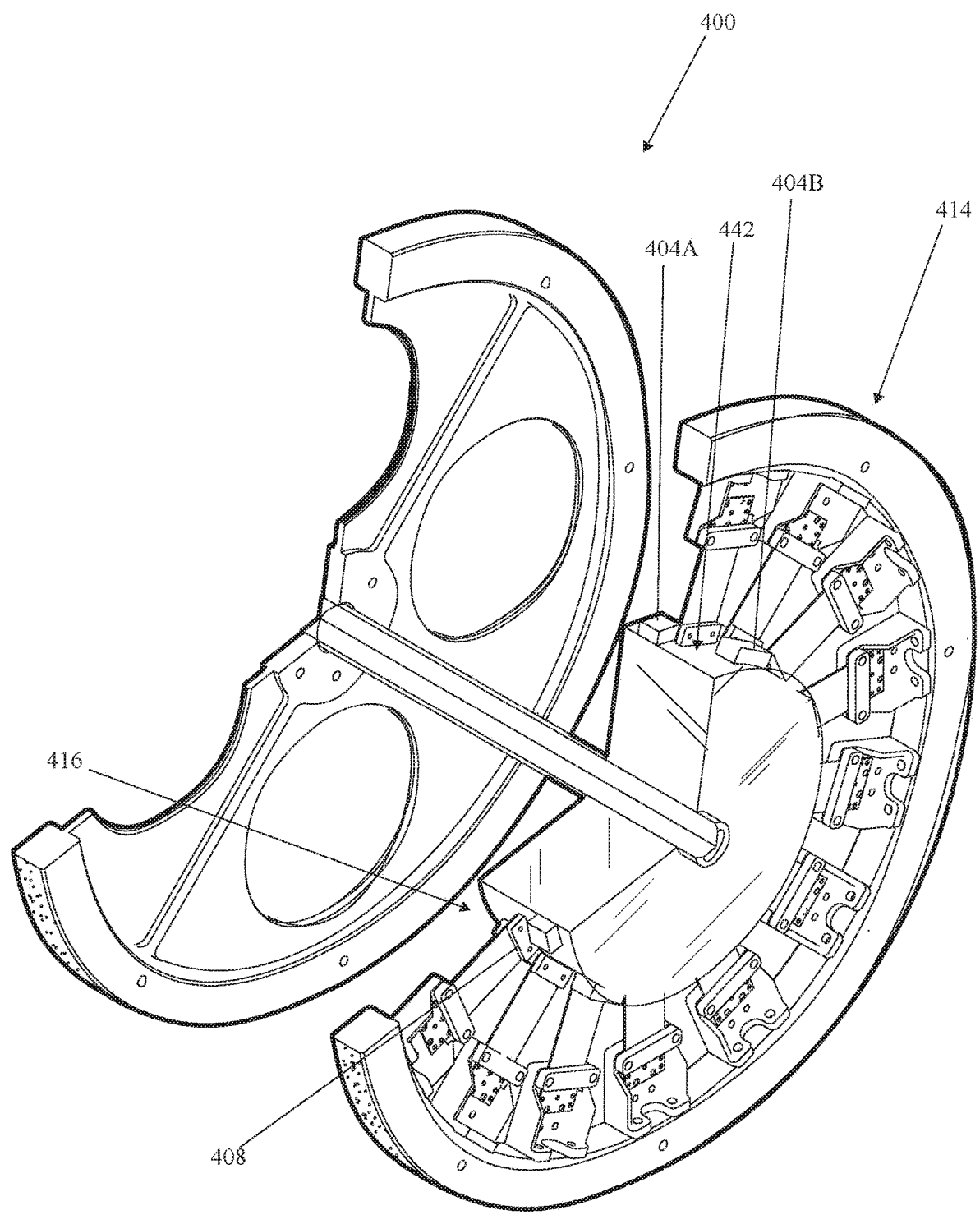
FIG. 22 is a cutaway perspective view of the version shown in FIG. 21.

The remainder of the detailed description will now focus on alternative embodiments, primarily considering variations in support structure that may achieve phased stimulation of the piezoelectric elements 102 as defined above. Now referring to FIG. 21-FIG. 22, as an example, an alternate configuration of the piezoelectric power generator is illustrated and is generally depicted as numeral 400. In the example version, the piezoelectric power generator 400 generally comprises a first support structure 414 for supporting the piezoelectric elements 402 in a predefined pattern and a second support structure 416 for supporting the actuators 404 in a predefined pattern. The first support structure 414 is a radially shaped ring having a longitudinal axis R, outer periphery 420 and an inner periphery 421. The piezoelectric elements 402—described in detail above in version 100—are positioned about the first support structure 414 inner periphery 421 extending radially towards the longitudinal axis R. The second support structure 416 is a radially shaped core having an outer radial surface 417 configured to position the plurality of actuators 404 thereon and sharing a longitudinal axis R with the first support structure 414. The actuators 404 are aligned and positioned on the outer radial surface 417 forming a first series 404A and a second series 404B. The first series of actuators 404A and the second series of actuators 404B form a concentric pathway 442 therebetween—configured to provide a path for the free end 408 of the piezoelectric elements 402 to freely travel through.

Therefore, as the second support structure 416 is rotated about the longitudinal axis R, each piezoelectric element 402 free end 408 is displaced by passing adjacent actuators 404, thereby providing at least first subset and a second subset of an electrical phase output.

Figure 23:
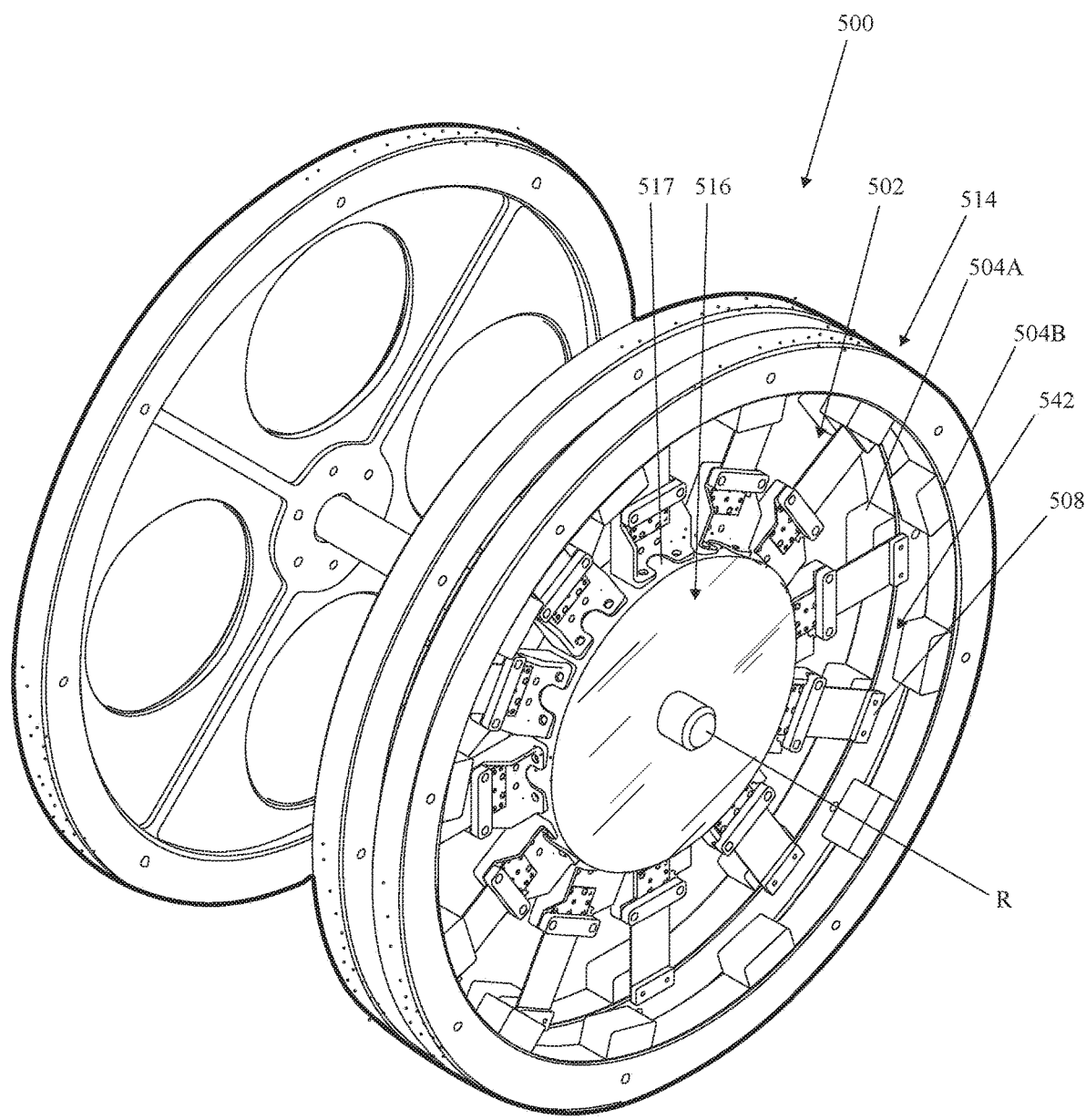
FIG. 23 is a perspective view of an alternative version of the piezoelectric power generator.

Now referring to FIG. 23, an alternative configuration of the piezoelectric power generator is illustrated and is generally depicted as numeral 500. The version 500 is similar in construction to that of example 400. However, the first support structure 514 configured in the shape of two parallel rotary rings supporting the plurality of actuators 504 in the predefined alternating pattern and the second support structure 516 configured as a radially shaped core having an outer radial surface 517 provides support for the plurality of piezoelectric elements 502. A first series of actuators 504A and the second series of actuators 504B form a concentric pathway 542 therebetween—configured to provide a path for the free end 508 of the piezoelectric elements 502 to freely travel through. In particular, the piezoelectric elements 502 are positioned about the outer radial surface 517 extending radially outward towards the actuators 504.

Consequently, as the second support structure 516 is rotated about the longitudinal axis R, each piezoelectric element free end 508 is displaced by passing adjacent actuators 504, therefore providing at least first subset and a second subset of an electrical phase output.

Figure 24:
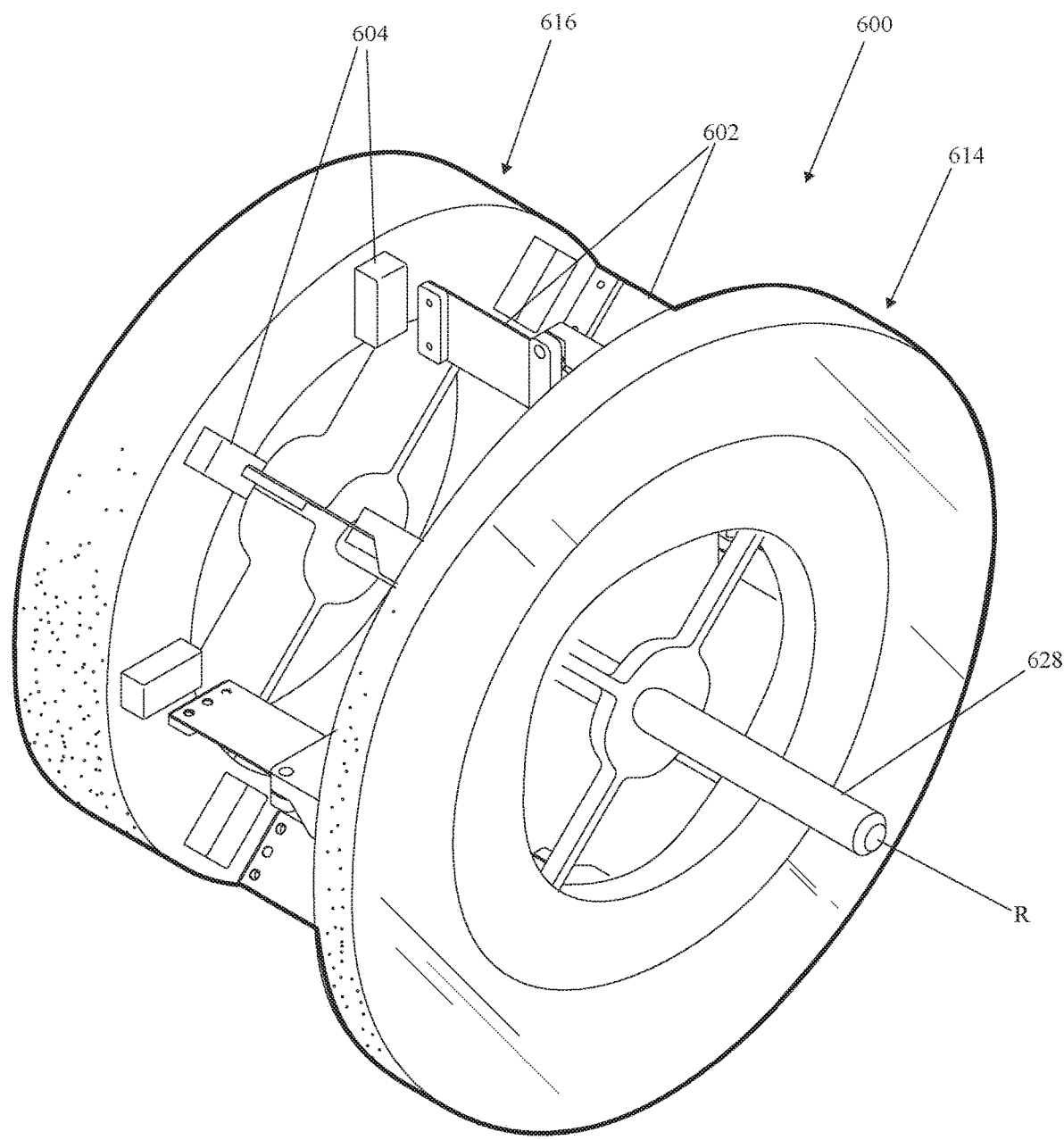
FIG. 24 is a perspective view of an alternative version of the piezoelectric power generator.
Figure 25:
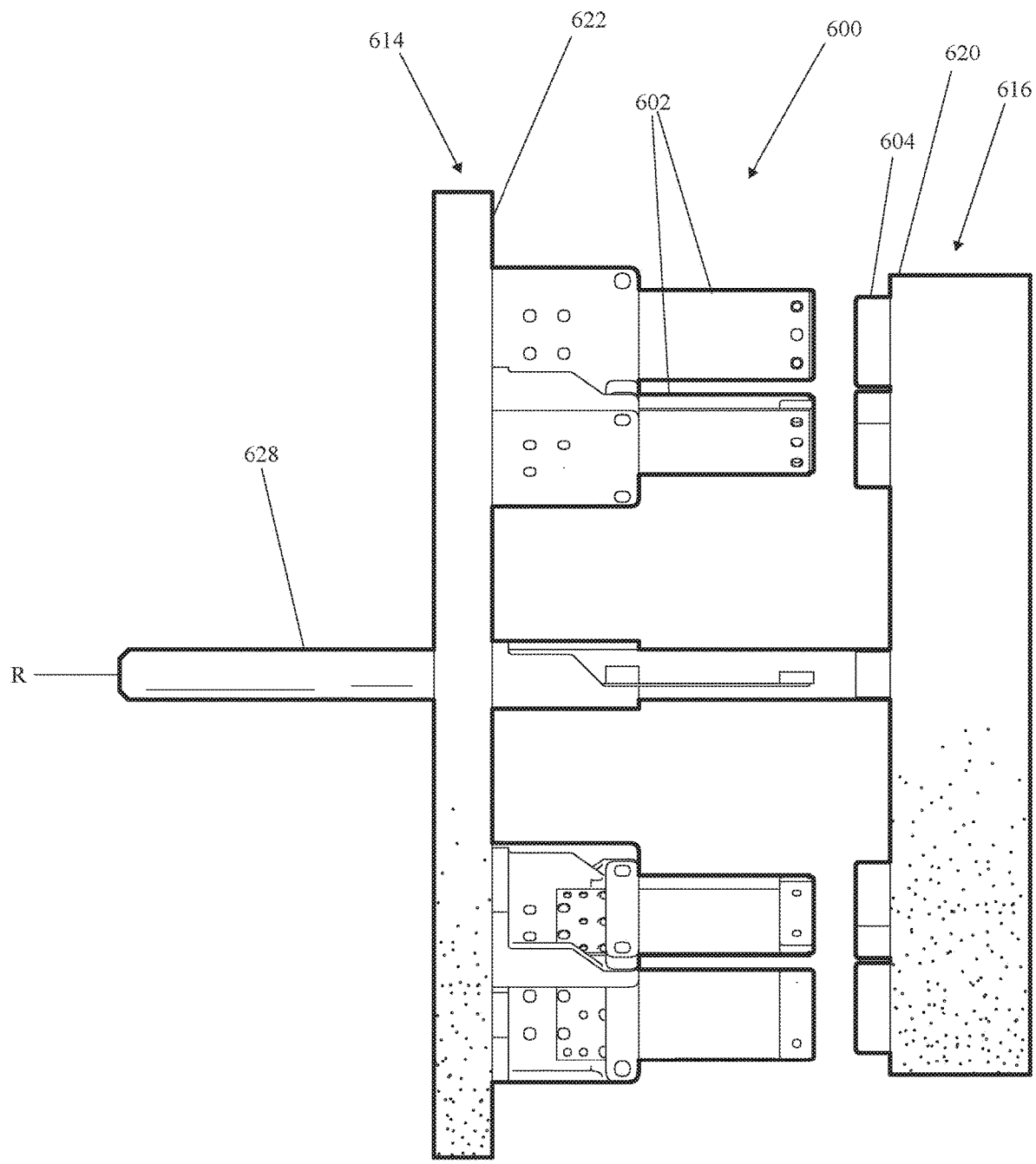
FIG. 25 is a side elevation view of the version shown in FIG. 24.
Figure 26:
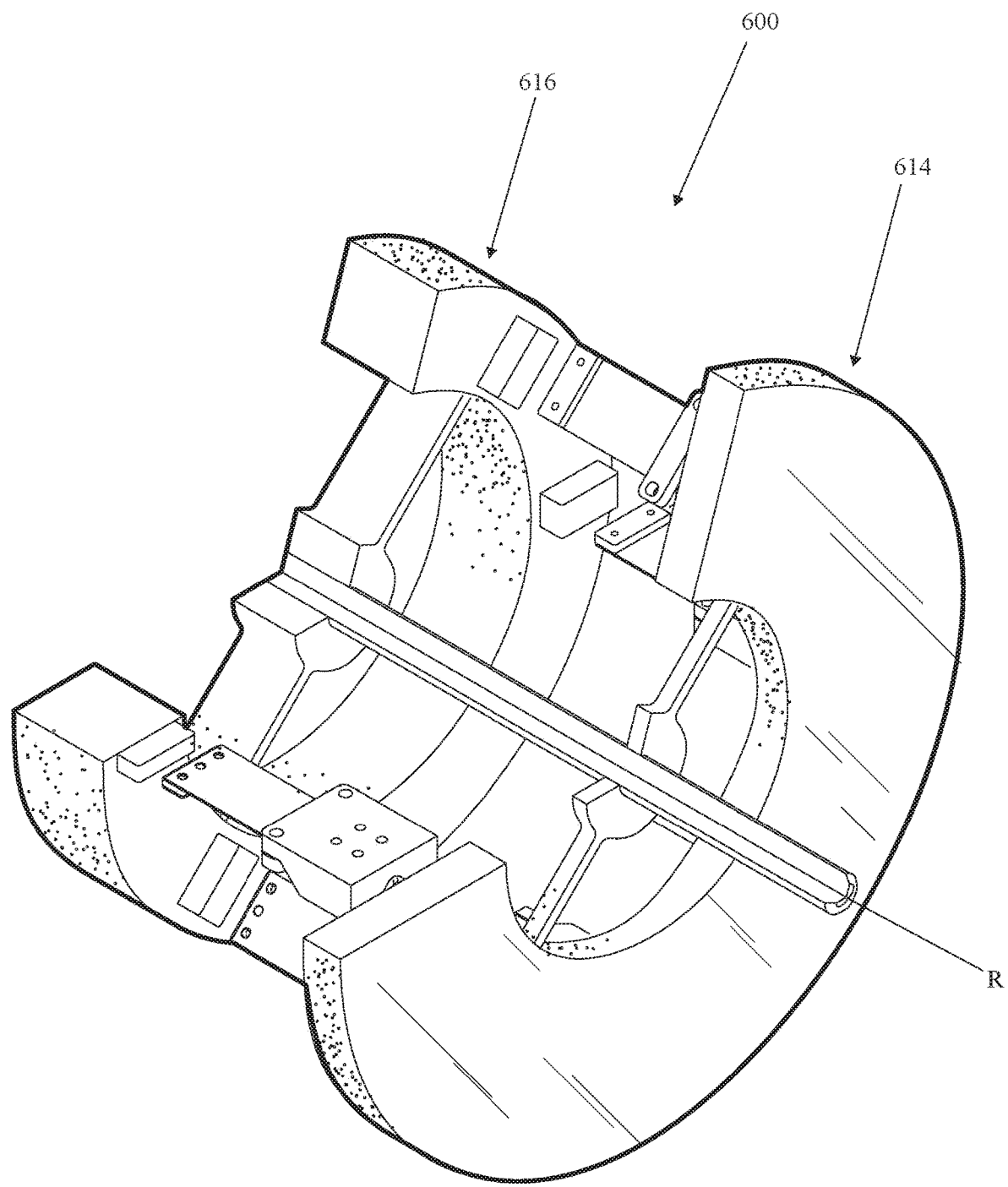
FIG. 26 is a perspective cutaway view of the version shown in FIG. 24.

Now referring to yet another embodiment illustrated by FIG. 24-FIG. 26, an alternate basic example version of the piezoelectric power generator will be described in detail and is generally depicted as numeral 600. In the example version, the first support structure 614 supports the piezoelectric elements 602 in a predefined pattern and the second support structure 616 supports the plurality of actuators 604 in a second predefined pattern. The piezoelectric elements 602 extend from the first support structure 614 towards the second support structure 616. The actuators 604 are generally positioned and patterned such that they interact or excite each of the piezoelectrical elements 602 simultaneously in at least a first subset as the second support structure 616 rotates about the axis R.

In the example version, the first support structure 614 is in the form of a stationary circular frame having a longitudinal axis R and an outer periphery 620. Similar in dimension, the second support structure 616 comprises a circular structure having an outer periphery 122, longitudinal axis R, and actuator angular support plate 126. The actuator support 116 configured to be rotated by the rotary shaft 628 along the longitudinal axis R.

The piezoelectric elements 602 are arranged in a predefined pattern. In the version, the piezoelectric elements 602 are radially aligned and equally distributed in a circular pattern about the R axis near the outer periphery 620 of the first support structure 614. Correspondingly, the actuators 404 are radially aligned and equally distributed in a circular pattern about the R axis near the periphery 622 of the second support structure 616. Therefore, as the second support structure 416 is rotated about the axis R, each actuator 604 passes a corresponding piezoelectric element 602 in a simultaneous manner, interacting and exciting each piezoelectric element 602 forming a subset formation which produces a collective electrical output phase. As the second support structure 616 continues to rotate, each actuator 104 interacts with the following corresponding piezoelectric element 102 simultaneously forming a second subset formation producing a second collective electrical output phase. Throughout operation, the piezoelectric power generator 600 produces at least a subset electrical output.

The present embodiments of the application can be made in any manner and of any material chosen with sound engineering judgement. Preferably, materials will be lightweight, strong, long lasting, economic and ergonomic.

Although preferred versions of the piezoelectric power generator have been described in considerable detail, other versions of the invention are possible.

All features disclosed in the specification (including and accompanying claims, abstract, and drawings) may be replaced by alternative features serving the same, equivalent or similar purpose unless expressly stated otherwise. Thus, unless stated otherwise, each feature disclosed is one example only of a generic series of equivalent or similar features.

What is claimed is:

1. A piezoelectric power generator comprising:
a rotor;
a plurality of piezoelectric elements in which each of the piezoelectric elements is configured to deflect in opposing directions, the opposing directions comprising a first direction and a second direction; and
a set of actuators comprising first actuators and second actuators;
wherein the first actuators and the second actuators are placed at opposing sides of the piezoelectric elements such that rotation of the rotor causes the actuators to maintain a controlled oscillation of the piezoelectric elements in which (i) the first actuators deflect the piezoelectric elements in the first direction and (ii) the second actuators deflect the piezoelectric elements in the second direction.

2. The piezoelectric power generator of claim 1, wherein the actuators are magnets, and wherein the first actuators are first magnets and the second actuators are second magnets.

3. The piezoelectric power generator of claim 2, wherein the magnets are arranged to deflect the piezoelectric elements by attracting a material coupled to the piezoelectric elements, the first magnets being arranged to attract the material in the first direction and the second magnets being arrange to attract the material in the second direction.

4. The piezoelectric power generator of claim 2, wherein each of the piezoelectric elements has an end disposed in a region between the first magnets and the second magnets, the end of each piezoelectric element comprising a material configured to interact with the magnets.

5. The piezoelectric power generator of claim 4, wherein the material at the ends of the piezoelectric elements is a ferrous material.

6. The piezoelectric power generator of claim 4, wherein the material at the ends of the piezoelectric elements is a magnet.

7. The piezoelectric power generator of claim 1, wherein the first actuators and second actuators are arranged to simultaneously interact with at least subsets of the piezoelectric elements.

8. The piezoelectric power generator of claim 7, wherein the actuators are arranged to impel each piezoelectric element in the opposing directions an alternating manner as the rotor rotates, such that each of the piezoelectric elements alternates between being impelled in the first direction by one of the first actuators and being impelled in the second direction by one of the second actuators.

9. The piezoelectric power generator of claim 7, wherein the actuators are arranged to cause oscillation of the piezoelectric elements that is controlled by opposing forces applied by the first actuators and the second actuators as the rotor rotates.

10. The piezoelectric power generator of claim 1, wherein the plurality of piezoelectric elements comprises a series of piezoelectric elements positioned adjacent to each other, and
wherein the actuators are arranged to deflect adjacent piezoelectric elements opposite each other so that adjacent piezoelectric elements generate electric current that is substantially 180 degrees out of phase.

11. The piezoelectric power generator of claim 1, wherein the actuators are arranged maintain constant influence on the piezoelectric elements as the rotor rotates.

12. The piezoelectric power generator of claim 1, wherein the piezoelectric elements comprise two groups of piezoelectric elements configured to simultaneously produce alternating current output at different phases as the rotor rotates; and
wherein the piezoelectric power generator further comprises an electric conduction system configured to sum electrical power of the different phases.

13. The piezoelectric power generator of claim 1, wherein the rotor has a rotational axis, and
wherein the opposing directions are substantially parallel to the rotational axis of the rotor.

14. The piezoelectric power generator of claim 1, wherein the rotor has a rotational axis, and
wherein the opposing directions are substantially orthogonal to the rotational axis of the rotor.

15. The piezoelectric power generator of claim 1, wherein the piezoelectric elements are coupled to and are configured to move with the rotor; and
wherein the actuators are not configured to move with the rotor.

16. The piezoelectric power generator of claim 1, wherein the actuators are coupled to and are configured to move with the rotor; and
wherein the piezoelectric elements are not configured to move with the rotor.

17. The piezoelectric power generator of claim 1, wherein the piezoelectric elements each comprise multiple layers of piezoelectric material,
wherein the piezoelectric elements comprise:
one or more piezoelectric elements that project from at least one side of the rotor and extend along an axis of rotation of the rotor;
one or more piezoelectric elements that project radially outward from the rotor; or
one or more piezoelectric elements that project radially inward toward the rotor.

18. The piezoelectric power generator of claim 1, further comprising an input drive shaft, a flywheel, a second drive shaft, and a continuously variable transmission,
wherein the input drive shaft operably couples a motive device, the flywheel, and the continuously variable transmission;
wherein the second drive shaft operably couples the continuously variable transmission with the rotor; and
wherein the continuously variable transmission is configured to convert varying input drive shaft speed into a stabilized second drive shaft speed for the rotor.

19. The piezoelectric power generator of claim 1, each of the piezoelectric elements is arranged to interact with multiple of the first actuators and multiple of the second actuators.

20. The piezoelectric power generator of claim 1, wherein the first actuators are spaced apart along a first circle, and the second actuators are spaced apart along a second circle, wherein the second circle is concentric with the first circle.

21. The piezoelectric power generator of claim 1, wherein the piezoelectric elements have a first side and a second side opposite the first side,
wherein the first actuators are disposed at the first side of the plurality of piezoelectric elements; and
wherein the second actuators are disposed at the second side of the plurality of piezoelectric elements.

22. The piezoelectric power generator of claim 1, wherein at least a portion of each of the piezoelectric elements is configured to travel through a space defined between the first actuators and the second actuators as the rotor rotates.

23. The piezoelectric power generator of claim 1, wherein each of the first actuators is configured to apply a force that impels the piezoelectric elements to deflect only in the first direction of the opposing directions; and
wherein each of the second actuators is configured to apply a force that impels the piezoelectric elements to deflect only in the second direction of the opposing directions.

24. The piezoelectric power generator of claim 1, wherein the actuators are arranged to maintain oscillations that deflect different groups of the piezoelectric elements in the different opposing directions to generate electric currents from the different groups that are substantially 180 degrees out of phase.

25. The piezoelectric power generator of claim 1, wherein the plurality of piezoelectric elements comprises a series of piezoelectric elements, and wherein the actuators are arranged to cause neighboring piezoelectric elements of the plurality of piezoelectric elements to oscillate opposite each other as the rotor rotates.

26. The piezoelectric power generator of claim 1, wherein the piezoelectric elements are arranged such that, during the controlled oscillation, each of the piezoelectric elements is acted on by one or more of the first actuators and by one or more of the second actuators.

27. The piezoelectric power generator of claim 1, wherein the set of actuators is arranged such that, as the rotor rotates, the actuators cause controlled oscillation of the piezoelectric elements in which (i) the first actuators each deflect multiple of the piezoelectric elements in the first direction and (ii) the second actuators each deflect multiple of the piezoelectric elements in the second direction.

28. The piezoelectric power generator of claim 1, wherein one or more of the piezoelectric elements has a free end.

29. The piezoelectric power generator of claim 1, wherein one or more of the piezoelectric elements is configured to deflect in the opposing directions by bending along a length of the piezoelectric element toward the opposing directions.

30. The piezoelectric power generator of claim 1, wherein the plurality of piezoelectric elements are placed between the first actuators and the second actuators such that, as the rotor rotates, ends of the piezoelectric elements or elements connected at the ends of the piezoelectric elements (i) extend into a space defined between the first actuators and the second actuators and (ii) move back and forth in the space along the opposing directions.

31. The piezoelectric power generator of claim 1, wherein the first actuators are spaced apart along a first circle, and wherein the second actuators are spaced apart along a second circle, and wherein the first actuators and the second actuators define a substantially annular space between the first actuators and the second actuators, and wherein the piezoelectric elements each have a portion configured to travel through the annular space as the rotor rotates.

32. The piezoelectric power generator of claim 1, wherein the plurality of piezoelectric elements each extend substantially parallel to an axis of rotation of the rotor, and wherein the first direction is radially toward the axis of rotation of the rotor and wherein the second direction is radially outward from the axis of rotation of the rotor.

33. The piezoelectric power generator of claim 1, wherein the actuators are positioned to constantly force deflection of the piezoelectric elements during the controlled oscillation to avoid natural vibration of the piezoelectric elements during the controlled oscillation.

34. The piezoelectric power generator of claim 1, wherein the piezoelectric power generator is configured such that, as the rotor rotates, the actuators concurrently oscillate a first group of the piezoelectric elements together in phase and a second group of the piezoelectric elements together in phase, wherein the phases of the first group and the second group have a predetermined phase relationship.

35. A piezoelectric power generator comprising:
a rotor;
a plurality of piezoelectric elements in which each of the piezoelectric elements is configured to deflect in opposing directions; and
a set of actuators arranged to induce oscillation of the piezoelectric elements between the opposing directions and to maintain controlled oscillation of the piezoelectric elements as the rotor rotates, the set of actuators comprising (i) first actuators each configured to deflect multiple of the piezoelectric elements in a first direction of the opposing directions and (ii) second actuators each configured to deflect multiple of the piezoelectric elements in a second direction of the opposing directions; and
wherein the actuators are positioned with respect to the plurality of piezoelectric elements to concurrently (i) oscillate a first group of the piezoelectric elements together at a first phase as the rotor rotates and (ii) oscillate a second group of the piezoelectric elements together at a second phase as the rotor rotates, wherein the second phase is different from the first phase.

36. The piezoelectric power generator of claim 35, wherein each of the piezoelectric elements has a first end, a second end, and a length between the first end and the second end;
wherein the first end of each of the piezoelectric elements is coupled to the rotor and the second end of each of the piezoelectric elements is free; and
wherein each of the piezoelectric elements is configured to deflect in the opposing directions by bending along the length of the piezoelectric element toward the opposing directions.

37. The piezoelectric power generator of claim 35, wherein each of the first actuators are arranged to exert a force on each of the piezoelectric elements toward the first direction, and
wherein each of the second actuators are arranged to exert a force on each of the piezoelectric elements toward the second direction.

38. The piezoelectric power generator of claim 35, wherein the actuators are arranged to deflect individual piezoelectric elements in the plurality of piezoelectric elements in a pattern that alternates between deflection toward the first direction by one of the first actuators and deflection toward the second direction by one of the second actuators.

39. The piezoelectric power generator of claim 35, wherein the second phase has a predetermined relationship with the first phase, and wherein the plurality of piezoelectric elements are arranged such that the piezoelectric elements in the first group and the piezoelectric elements in the second group are interspersed so that neighboring piezoelectric elements oscillate with different phases.

40. A piezoelectric power generator comprising:
a rotor;
a plurality of piezoelectric elements that are coupled to the rotor and are configured to move with the rotor, wherein each of the piezoelectric elements is configured to deflect in opposing directions; and
a set of actuators arranged to deflect the plurality of piezoelectric elements in the opposing directions as the rotor rotates, wherein the actuators are each configured to interact with multiple of the piezoelectric elements, the actuators comprising first actuators and second actuators;
wherein the first actuators and the second actuators are placed at opposing sides of the piezoelectric elements such that rotation of the rotor (i) causes the first actuators to deflect the piezoelectric elements in a first direction of the opposing directions and (ii) causes the second actuators to deflect the piezoelectric elements in a second direction of the opposing directions; and
wherein the actuators are configured to deflect each of the piezoelectric elements in a manner that alternates between (i) one of the first actuators deflecting the piezoelectric element in the first direction and (ii) one of the second actuators deflecting the piezoelectric element in the second direction.

41. The piezoelectric power generator of claim 40, wherein the actuators are arranged to control the piezoelectric elements to oscillate in a manner that the piezoelectric elements produce electrical outputs have predetermined phase relationships with each other.

* * * * *